US009586810B2

United States Patent
Fuhrmann et al.

(10) Patent No.: US 9,586,810 B2
(45) Date of Patent: Mar. 7, 2017

(54) POLYMERIC SUBSTRATE HAVING AN ETCHED-GLASS-LIKE SURFACE AND A MICROFLUIDIC CHIP MADE OF SAID POLYMERIC SUBSTRATE

(75) Inventors: Gerda Fuhrmann, Stuttgart (DE); Gabriele Nelles, Stuttgart (DE); Silvia Rosselli, Stuttgart (DE); Nikolaus Knorr, Stuttgart (DE); Alfred Paris, Salzburg (AT); Maria Kaufmann, Anif (AT); Georg Bauer, Salzburg (AT)

(73) Assignees: Sony Corporation, Tokyo (JP); Sony DADC Austria AG, Anif (AT)

( * ) Notice: Subject to any disclaimer, the term of this patent is extended or adjusted under 35 U.S.C. 154(b) by 0 days.

(21) Appl. No.: 13/811,800

(22) PCT Filed: Aug. 1, 2011

(86) PCT No.: PCT/EP2011/003855
§ 371 (c)(1),
(2), (4) Date: Jan. 23, 2013

(87) PCT Pub. No.: WO2012/013361
PCT Pub. Date: Feb. 2, 2012

(65) Prior Publication Data
US 2013/0121892 A1    May 16, 2013

(30) Foreign Application Priority Data
Jul. 30, 2010   (EP) .................... 10007998

(51) Int. Cl.
*B81B 1/00*    (2006.01)
*B01L 3/00*    (2006.01)
(Continued)

(52) U.S. Cl.
CPC   *B81B 1/00* (2013.01); *C08J 7/04* (2013.01); *C08J 7/047* (2013.01); *C08J 7/06* (2013.01);
(Continued)

(58) Field of Classification Search
USPC .... 422/502, 504, 507; 435/6.14, 91.2, 287.2
See application file for complete search history.

(56) References Cited

U.S. PATENT DOCUMENTS

| 4,863,762 A | 9/1989 | Aramaki et al. |
| 5,084,356 A | 1/1992 | Deak et al. |

(Continued)

FOREIGN PATENT DOCUMENTS

| CN | 1688518 A | 10/2005 |
| CN | 101650370 A | 2/2010 |

(Continued)

OTHER PUBLICATIONS

Bhattacharyya, A., et al., "Mechanical and chemical analysis of plasma and ultraviolet-ozone surface treatments for thermal bonding of polymeric microfluidic devices," Lab Chip, vol. 7, pp. 876-882, (Apr. 27, 2007) XP 002667538.
(Continued)

*Primary Examiner* — Jennifer Wecker
(74) *Attorney, Agent, or Firm* — Oblon, McClelland, Maier & Neustadt, L.L.P.

(57) ABSTRACT

The present invention relates to a polymeric substrate having a glass-like surface, in particular an etched-glass-like surface and to a chip made of at least one such polymeric substrate. The present invention also relates to a method of providing a polymeric substrate with an etched-glass-like surface. Moreover, the present invention relates to a kit for manufacturing a chip using such polymeric substrate. Moreover, the present invention relates to the use of a polymeric substrate having a glass-like surface, in particular an etched-glass-like surface for manufacturing a chip.

31 Claims, 36 Drawing Sheets

(51) Int. Cl.

| | |
|---|---|
| *B81C 3/00* | (2006.01) |
| *C08J 7/04* | (2006.01) |
| *C08J 7/06* | (2006.01) |
| *C08J 7/12* | (2006.01) |
| *B32B 3/02* | (2006.01) |
| *B32B 37/14* | (2006.01) |
| *B05D 1/00* | (2006.01) |
| *C23C 16/04* | (2006.01) |
| *B81C 1/00* | (2006.01) |
| *C08L 83/04* | (2006.01) |

(52) U.S. Cl.
CPC ......... *C08J 7/123* (2013.01); *B01L 3/502707* (2013.01); *B01L 2300/16* (2013.01); *B01L 2300/161* (2013.01); *B05D 1/62* (2013.01); *B81C 1/00206* (2013.01); *B81C 3/00* (2013.01); *B81C 2201/0197* (2013.01); *C08J 2383/04* (2013.01); *C08L 83/04* (2013.01); *C23C 16/045* (2013.01); *Y02P 20/582* (2015.11); *Y10T 156/10* (2015.01)

(56) References Cited

U.S. PATENT DOCUMENTS

| | | | |
|---|---|---|---|
| 5,368,887 A | 11/1994 | Hoshino et al. | |
| 5,510,147 A | 4/1996 | Volpe | |
| 5,618,628 A | 4/1997 | Volpe | |
| 5,683,757 A | 11/1997 | Iskanderova et al. | |
| 6,210,790 B1 | 4/2001 | Crivello | |
| 7,419,639 B2 | 9/2008 | Osterfeld et al. | |
| 2004/0038081 A1 | 2/2004 | Wang et al. | |
| 2004/0151626 A1* | 8/2004 | Cunningham et al. | 422/58 |
| 2005/0056321 A1* | 3/2005 | Rehm et al. | 137/528 |
| 2005/0271893 A1* | 12/2005 | Kobrin | B05D 1/185 428/633 |
| 2006/0110294 A1* | 5/2006 | Engstrom | B01J 19/0093 422/506 |
| 2007/0015179 A1 | 1/2007 | Klapperich et al. | |
| 2007/0020468 A1 | 1/2007 | Ekeland et al. | |
| 2008/0177021 A1* | 7/2008 | Berlin et al. | 528/10 |
| 2009/0209029 A1 | 8/2009 | Guia et al. | |
| 2010/0111770 A1* | 5/2010 | Hwang et al. | 422/100 |
| 2011/0151223 A1* | 6/2011 | Kim | B32B 7/12 428/216 |
| 2012/0012527 A1* | 1/2012 | Allen | B01D 61/027 210/654 |
| 2012/0078531 A1* | 3/2012 | Lo et al. | 702/21 |
| 2012/0107851 A1* | 5/2012 | Killard et al. | 435/13 |
| 2012/0219727 A1* | 8/2012 | Gandhiraman | B01L 3/502707 427/563 |

FOREIGN PATENT DOCUMENTS

| | | | | |
|---|---|---|---|---|
| EP | 2096445 A1 | * | 9/2009 | ............ B81C 3/00 |
| GB | 1 591 064 | | 6/1981 | |
| JP | 2000-39420 A | | 2/2000 | |
| JP | 2003-183425 A | | 7/2003 | |
| JP | 2003-526092 A | | 9/2003 | |
| JP | 2003-286358 A | | 10/2003 | |
| JP | 2006 132944 | | 5/2006 | |
| JP | 2006-234600 A | | 9/2006 | |
| JP | 2008-224327 A | | 9/2008 | |
| WO | 01/66244 A1 | | 9/2001 | |

OTHER PUBLICATIONS

Harrison, D.J., et al., "Capillary Electrophoresis and Sample Injection Systems Integrated on a Planar Glass Chip," Anal. Chem., vol. 64, No. 17, pp. 1926-1932, (Sep. 1, 1992).
Reyes, D.R., et al., "Micro Total Analysis Systems. 1. Introduction, Theory, and Technology," Anal. Chem., vol. 74, No. 12, pp. 2623-2636, (Jun. 15, 2002).
Auroux, P.A., et al., "Micro Total Analysis Systems. 2. Analytical Standard Operations and Applications," Anal. Chem., vol. 74, No. 12, pp. 2637-2652, (Jun. 15, 2002).
Becker, H., et al., "Polymer microfluidic devices," Talanta, vol. 56, pp. 267-287, (2002).
Liu, J., et al., "Permanent surface modification of polymeric capillary electrophoresis microchips for protein and peptide analysis," Electrophoresis, vol. 27, pp. 3533-3546, (2006).
Belder, D., et al., "Surface modification in microchip electrophoresis," Electrophoresis, vol. 24, pp. 3595-3606, (2003).
Wong, I., et al., "Surface molecular property modifications for poly(dimethylsiloxane) (PDMS) based microfluidic devices," Microfluid Nanofluid, Total 16 Pages, (Apr. 18, 2009).
Berdichevsky, Y., et al., "UV/ozone modification of poly(dimethylsiloxane) microfluidic channels," Sensors and Actuators B, Chemical, Elsevier, vol. 97, pp. 402-408, (2004).
International Search Report Issued Mar. 7, 2012 in PCT/EP11/03855 Filed Aug. 1, 2011.
Combined Chinese Office Action and Search Report issued Jan. 13, 2014 in Patent Application No. 201180037666.9 (submitting English language translation only).
David C. Duffy, et al., "Rapid prototyping of microfluidic systems in poly(dimethylsiloxane)", Analytical Chemistry, vol. 70, No. 23, Dec. 1, 1998, pp. 4974-4984.
Notice of Rejection dated May 12, 2015 issued in corresponding Japanese patent application No. 2013-521019.
Notice of Refusal dated Feb. 2, 2016 issued in corresponding Japanese patent application No. 2013-521019.

* cited by examiner

| Apparatus | Film thickness | | Water contact angle after 24h / 70 °C/ 70% relative humidity |
|---|---|---|---|
| E-gun | 20 nm | < 5° | 30-40° |
| Sputtered | 20 nm | < 5° | >90° |

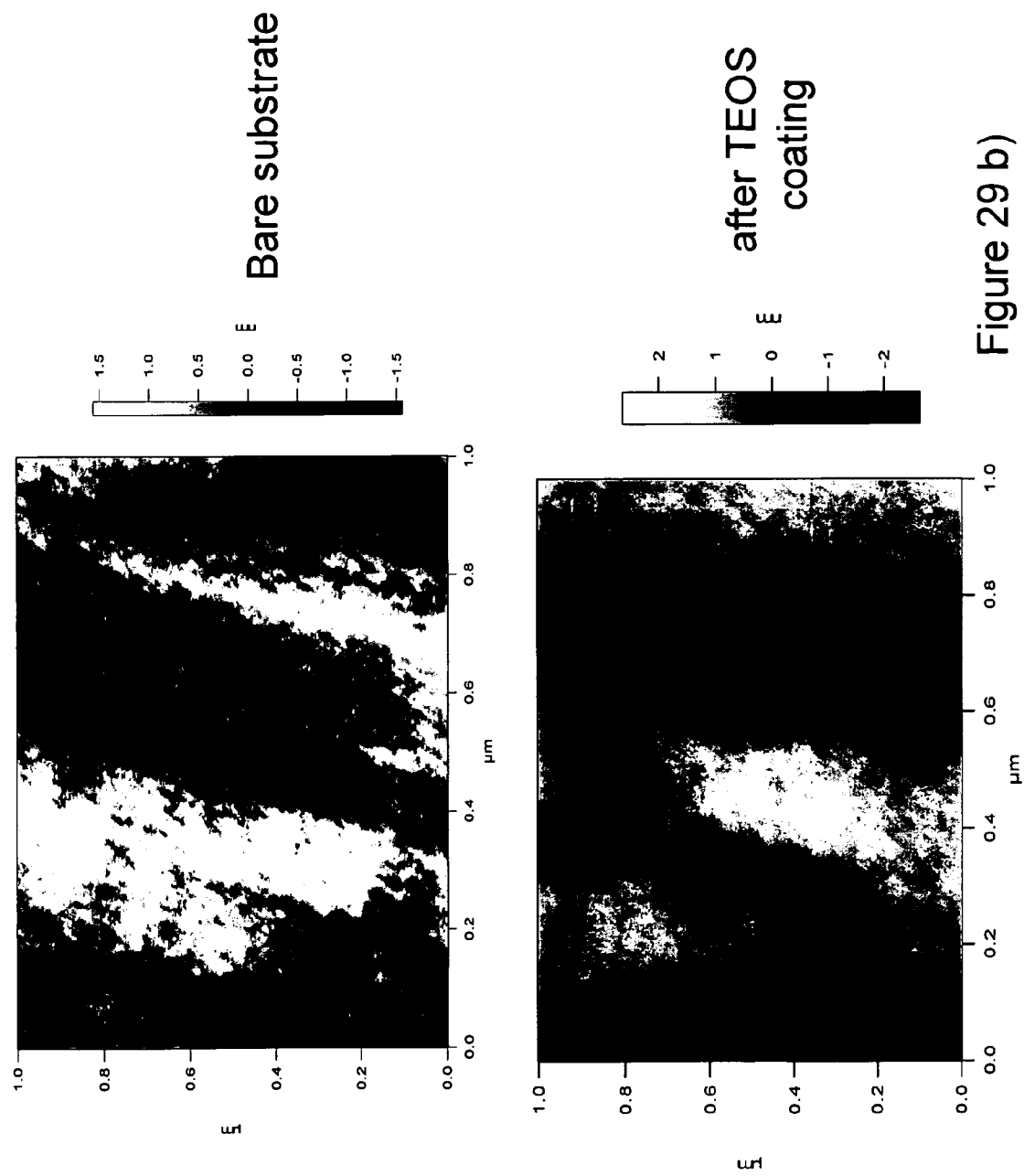

POLYMERIC SUBSTRATE HAVING AN ETCHED-GLASS-LIKE SURFACE AND A MICROFLUIDIC CHIP MADE OF SAID POLYMERIC SUBSTRATE

The present invention relates to a polymeric substrate having a glass-like and for an etched-glass-like surface and to a chip made of at least one such polymeric substrate. The present invention also relates to a method of providing a polymeric substrate with a glass-like and for an etched-glass-like surface. Moreover, the present invention relates to a kit for manufacturing a chip using such polymeric substrate. Moreover, the present invention relates to the use of a polymeric substrate having a glass-like surface for manufacturing a chip.

The integration of many analytical operations on a minaturized platform has been described as the "lab-on-chip" concept by Manz and Widmer already in the last decade (D. J. Harrison, A. Manz, Z. Fan, H. Luedi, H. M. Widmer, Anal. Chem. 64, 1992, 1926). Such microchip systems including microfluidic systems, sensors, arrays (so-called biochips), chemical synthesis on-chip, to name a few, allow small sample volume and low power consumption, enable sample treatment, various chemical reactions, fast separation and detection times.

Since the concept emerged, the field grew rapidly and the developments regarding the applications to new analytical areas and novel materials have been summarized in some reviews. (D. R. Reyes, D. Iossifidis, P. A. Auroux, A. Manz, Anal. Chem. 74, 2002, 2623; P. A. Auroux, D. Iossifidis, D. R. Reyes, A. Manz, Anal. Chem. 74, 2002, 2637).

These microsystem chips or microfluidic chips or microchips are mostly prepared from glass, silicon or fused silica substrate materials due to their good optical properties (transparent in the 450-700 nm range, low auto-fluorescence) and chemical inertness. However, devices based on these materials are costly because they are fabricated using semiconductor microfabrication techniques that include the formation of etching mask, photolithography, and substrate etching. Therefore, alternative materials have been investigated and especially various polymers as alternative materials, such as polydimethylsiloxane (PDMS), poly(methyl methacrylate) (PMMA), polycarbonate (PC), polystyrene (PS), polyethyleneterephthalate (PETG), polyvinylchloride (PVC) and polyimide (PI), have been studied because of their lower cost, compatibility with biomolecules, optical transparency, number of replication strategies and disposability (H. Becker, L. E. Locascio Gartner, Talanta, 56, 2002, 267).

Flow of fluids in macroscopic channels is generally determined by properties intrinsic to the fluid like, e.g., its viscosity. In miniaturized systems, such as microfluidic chips having miniaturized capillaries but also high-throughput array formats, surface properties and surface effects play a key role because of the large surface-to-volume ratio when compared to classical macroscopic systems and the fact that interactions of fluids with materials are determined by the surface, and not the bulk properties of these materials. For good performance of such a chip one of the main issues is therefore a well defined and homogeneous channel geometry and surface property.

One of the major obstacles when changing the substrate material to plastic is the difference in the surface properties of the new substrate materials and resulting differences in the interaction with the analyte. For example, a common problem of most microfluidic devices fabricated from polymeric material is the adsorption of the analytes to the channel walls during the separation process, especially of molecules such as proteins or of surfactants such as sodium dodecyl sulfate (SDS) used in protein separation gels with their hydrophobic side facing the hydrophobic polymer surface. This can result not only in sample loss, but also in changes in electroosmotic flow or analyte-wall interaction leading to deterioration of separation performance. For other analytical microchip systems, such as enzyme reactors or bioassay platforms, an efficient binding of reagents and bioprobes is essential. Another problem is the separation of components of the analyte matrix from the channel surface, leading to a layer of enhanced electroosmotic flow, which may disturb the electrophoretic measurements.

Thus, surface modification and treatment of the polymeric materials is performed to control non-specific adsorption of bioanalytes on the walls. Methods for the surface modification include dynamic coating (non-permanent) and covalently (chemically) bound permanent coatings (J. Liu, M. L. Lee, Electrophoresis, 2006, 27, 3533-3546; D. Belder, M. Ludwig, Electrophoresis, 2003, 24, 3595-3606). Reported are also surface modifications of polymeric substrates by employing plasma, electron beam or ion beam. Those modifications are regarded as permanent but some properties are, not stable over time like e.g., the hydrophilicity.

Dynamic coating is a convenient modification to perform. In this case, surface-active coating materials or surface modifiers are brought in contact with the surface, for example by rinsing through the channel. The coating materials are physisorbed onto the surface. However, the potential of dynamic surface modification is limited in many application due to eventual desorption from the polymer surface resulting again in surface property change during usage. Further the desorbed surface modifiers could also interact with the analytes.

Permanent surface modification is therefore regarded as the most effective way for surface modification. Ideally, the modification is stable and does not have to be regenerated. However, since the modification needs specific chemical reactions or treatments it is often more labor-intensive in the production process.

Assays are also a biotechnological application where polymer material can be used for the device preparation. Transferring assay chemistries which have been developed for glass often requires the addition of detergents to ensure the wetting of the hydrophobic plastic surface or to avoid the sticking of proteins or other biomolecules on these hydrophobic surfaces. Adding such detergents may negatively impact the performance of the assay, since such substances can lead to denaturation of proteins or other biomolecules. Large protein molecules can easily lose their functionality in the presence of detergents or other surface active substances. It should also be mentioned that Cells or cell fragments are most easily damaged or destroyed by exposure to detergents or hydrophobic plastic surfaces. Any of the above examples represent cases, where the protein or biomolecule, large protein assemblies or cells and cell fragments are exposed to none native conditions in which they may behave very differently from within their natural environment.

Accordingly, there is a need for materials that allow easy and low cost fabrication of systems for biotechnological application whilst at the same time providing the advantageous properties of glass-substrates. Accordingly, it was an object of the present invention to provide means for the efficient fabrication of chips for various applications, in particular biotechnological applications. It was also an object of the present invention to provide means for the efficient fabrication of assay systems, in particular for biotechnological applications.

This object is solved by a polymeric substrate having a glass-like surface, in particular an etched-glass-like surface, said glass-like surface, in particular said etched-glass-like surface mimicking the surface of glass, in particular etched-glass in one or several of:

chemical content, chemical composition, chemical structure, homogeneity, roughness, morphology, in particular porosity, hydrophilicity, surface energy and adsorption affinity, surface functionality, chemical and physical surface reactivity, zeta potential and surface charge.

In one embodiment, said surface has been modified by plasma treatment and/or reactive ion treatment for increased roughness and hydrophilicity and/or is a thin film of silicon oxide and/or is a polymer thin film having increased intrinsic roughness and/or intrinsic porosity and/or increased hydrophilicity.

In one embodiment, said polymeric substrate is a polymer of synthetic or natural origin, preferably injection-moldable polymers, more preferably one of the material classes containing: polyolefines, polyethers, polyesters, polyamides, polyimides, polyvinylchlorides, polyacrylates; including their modifications, derivates, derivatives and copolymers; more specifically one of the list containing acrylnitril-butadien-styrole (ABS), cyclo-olefin-polymers and copolymers (COC/COP), Polymethylene-methacrylate (PMMA), Polycarbonate (PC), Polystyrole (PS), Polypropylene (PP), Polyvinylchloride (PVC), Polyamide (PA), Polyethylene (PE), Polyethylene-terephthalate (PET), Polytetrafluor-ethylene (PTFE), Polyoxymethylene (POM), Thermoplastic elastomers (TPE), thermoplastic polyurethane (TPU), Polyimide (PI), Polyether-ether-ketone (PEEK), Polylactic acid (PLA), polymethylpentene (PMP), and derivatives thereof, wherein the polymer is optionally filled with an inorganic material such as carbon black, oxides such as $SiO_2$, $Al_2O_3$, $TiO_2$, $ZrO_2$, $Fe_2O_3$, in particular metal oxides, and semiconductors such as ZnS, CdS, CdSe to name some. An example for such filled polymer is a cyclic olefin polymer filled with $TiO_2$.

The objects of the present invention are also solved by a method of providing a polymeric substrate with a glass-like surface, in particular an etched-glass-like surface, said method comprising the following steps:

a) providing a polymeric substrate which, preferably, is made of a polymeric substrate material according to the present invention;

and one of the following steps:

b1) coating a surface of said polymeric substrate with $SiO_x$; x being in the range of from 1 to 2;

b2) coating a surface of said polymeric substrate with a $SiO_x$-precursor and converting said $SiO_x$-precursor into $SiO_x$, x being in the range of from 1 to 2;

b3) endowing a surface of said polymeric substrate with a glass-like surface morphology, in particular an etched glass-like surface morphology, by coating a surface of said polymeric substrate with a coating material having increased roughness in comparison to the uncoated surface of said polymeric substrate and/or increased hydrophilicity, said coating material preferably being a polymer, and/or by plasma-treating and/or reactive ion etching (RIE) and/or by treatment with UV Ozone cleaner of a surface of said polymeric substrate or said coated polymeric substrate, preferably using argon, oxygen, $H_2O$, $H_2$, fluorinated methane gases, such as $CF_4$, $CHF_3$, $CH_2F_2$, or a mixture of or a sequential use of any of the foregoing, to induce roughness and hydrophilicity on said surface;

b4) a combination of b1), b2) and b3) in any order.

In one embodiment, plasma treatment occurs with a frequency in the range of from 0.1 KHz to 100 GHz. In one embodiment, an etched-glass like surface morphology can also be achieved by a sequential use of plasma-treatment and reactive ion etching. In one embodiment, the plasma treatment occurs with a frequency in the range of from 1 KHz to 999 KHz. In another embodiment, plasma treatment occurs with a frequency in the range of from 1 MHz to 999 MHz. In yet another embodiment, plasma treatment occurs with a frequency in the range of from 1 GHz to 100 GHz. In one embodiment, the plasma treatment may involve a single step or multiple steps of plasma treatment. The term "Ar/O2-plasma", as used herein, in one embodiment, refers to a plasma treatment using argon, followed by plasma treatment using oxygen, or vice versa. In another embodiment, it may refer to a plasma treatment using a mixture of argon and oxygen in a single step. In yet another embodiment, the term refers to multiple steps of plasma treatment using argon, followed by multiple steps of plasma treatment using oxygen, or vice versa. In yet another embodiment, the term refers to a single step or multiple steps of plasma treatment using argon, followed by a single step or multiple steps of plasma treatment using oxygen, or vice versa.

In one embodiment, the plasma treatment is an $Ar/O_2$-plasma treatment.

In one embodiment, the plasma treatment is an Ar/UV Ozone treatment.

The term Ar/UV Ozone treatment as used herein, in one embodiment refers to a plasma treatment using Argon, followed by UV Ozone treatment, or vice versa. In another embodiment, it may refer to a plasma treatment using Argon, together with UV Ozone treatment in a single step. In yet another embodiment, the term refers to multiple steps of plasma treatment using Argon, followed by multiple steps of UV Ozone treatment, or vice versa. In yet another embodiment, the term refers to a single step or multiple steps of plasma treatment using Argon, followed by a single step or multiple steps of UV Ozone treatment, or vice versa.

In one embodiment, step b1), b2) and/or b3) is performed by physical vapor deposition methods, such as:

thermal deposition (physical vapor deposition)
electron-beam (E-gun) deposition
sputtering,
by chemical vapor deposition (CVD),
by film growth on the surface, such as electroless plating or electrochemical deposition,
spray coating
dip coating
gas-phase deposition
roll-to-roll deposition,
screen printing,
doctor blading,
wet coating,
dynamic coating,
CVD,
or a combination of several of the foregoing.

In one embodiment, the converting in step b2) is performed by one of:

annealing, preferably thermal annealing
irradiating with electromagnetic radiation, such as infrared or UV, preferably UV treatment in solution with water or base or acid, or a combination of water and base, or a combination of water and acid.

In one embodiment, said $SiO_x$-precursor is selected from the group comprising i) alkoxy- or alkyl-chlorosilane, $SiX_4$, trisiloxane compound $Si_3O_2X_6$, X being, independently, at each occurrence OR or halogen, R being alkyl, alkyl being preferably $C_1$-$C_{20}$-alkyl, preferably ethyl or methyl;

ii) polysilazane, such as perhydropolysilazane, —[Si(H)$_2$—N(H)—]$_n$, n being selected from 3 to 10000, or polyorganosilazane —[Si(R)$_2$—N(R)—]$_n$, R being alkyl, alkyl being preferably $C_1$-$C_{20}$-alkyl, n being selected from 3 to 100 000;

iii) a sol-gel containing $SiO_x$ particles, said particles preferably having a diameter of about 1 nm to 10 μm, preferably 10 nm to 100 nm, suspended in a solvent-based matrix, the solvent being preferably an alcohol, preferably ethanol.

In one embodiment, in steps b1)-b3), together with said $SiO_x$, $SiO_x$-precursor or said polymer, additional materials are coated on said surface of said polymeric substrate, said additional material being selected from $Si_2N_3$, $Al_2O_3$, $B2O_3$, $TiO_2$, $Na_2O$, $CaO$, $K_2O$, $SO_3$, $MgO$, $Fe_2O_3$, $SiO_x$ (x being <2).

In one embodiment, said coating material, in particular said polymer, having increased roughness and/or intrinsic porosity is selected from polytetrafluoroethylenes (Teflon), such as 2,2-bistrifluoromethyl-4,5-difluoro-1,3-dioxoletetrafluoroethylene copolymer (designated Teflon AF 2400 by Du Pont), nafion, polysulfones, poly(oxy-2,6-dimethyl-1,4-phenylene), and the group of substituted acetylene polymers, like poly[1-(trimethylsilyl)-1-propyne] (PTMSP), poly[1-(trimethylgermyl)-1-propyne], poly(4-methyl-2-pentyne), poly[1-phenyl-2-(p-trimethylsilylphenyl)acetylene], and poly[2,4,5-tris(trifluoromethyl)-phenylacetylene].

The term "nafion", as used herein, is meant to refer to a sulfonated tetrafluoroethylene based fluoropolymer-copolymer. In nafion, perfluorovinylether groups which are terminated with sulfonate groups, are incorporated into a tetrafluoroethylene (Teflon) backbone. The sulfonic acid functional groups self-organize into hydrophilic water channels of a few nanometers in diameter In one embodiment, said method further comprises a step c) post-treating said substrate by one or several of drying,
water treatment,
tempering,
sintering,
solvent treatment,
plasma treatment,
reactive ion etching,
treatment with UV-Ozone cleaner,
and any combination of the foregoing.

The term "treatment with UV-Ozone cleaner" or "UV Ozone treatment", as used herein, is meant to refer to a treatment involving the irradiation by short wavelength UV radiation, typically in the range of from 180 nm to 260 nm, usually also using two ore more different wavelengths from within such range. Such irradiation leads to in-situ generation of atomic oxygen and ozone which in term react with contaminant substrates. Hence UVO cleaner treatment will result in the cleaning of a surface.

The method according to the present invention may also involve one or several "pretreatment" steps, which is (are) performed on the substrate before any coating step is performed. Such pretreatment may be a plasma treatment, a heat treatment, an exposure to chemicals, and activation of the substrate surface by endowing it with chemical functional groups etc. Such pretreatment step(s) may facilitate the subsequent steps performed thereafter and may improve the quality of the substrate.

In one embodiment, said method is performed at least on a first polymeric substrate made of a material, as defined further above, wherein said first polymeric substrate thereby is provided with at least a first glass-like surface, in particular a first etched-glass-like surface, said method further comprising the bonding step:

bonding said first substrate to a second substrate by bringing said first glass-like surface, in particular etched-glass-like surface in contact with a surface of a second substrate, by pressing said first and second substrate together, preferably by a pressure in the range of from 0.2 N/mm$^2$ to 5 N/mm$^2$, more preferably in the range of from 0.5 N/mm$^2$ to 1 N/mm$^2$, for a time in the range of from 10 s to 600 s, more preferably in the range of from 30 s to 120 s and by exposing said first and second substrate to a temperature in the range of from 40° C. to 200° C., preferably 60° C. to 120° C., and/or exposing said first and second substrate to a vapor of solvent immediately before pressing to increase their bonding to each other.

In one embodiment, said first polymeric substrate is a solid substrate, and wherein said second substrate is either a solid substrate or a flexible foil.

In one embodiment, said second substrate is a polymeric substrate made of a material as defined further above, or said second substrate is made of a material selected from glass, quartz, silicon nitride and silicon oxide, or, if said second substrate is a flexible foil, said second substrate is made of polyolefines, polyethers, polyesters, polyamides, polyimides, polyvinylchlorides, polyacrylates; including their modifications, derivates, derivatives and copolymers; more specifically one of the list containing acrylntiril-butadien-styrole (ABS), cyclo-olefin-polymers and copolymers (COC/COP), Polymethylene-methacrylate (PMMA), Polycarbonate (PC), Polystyrole (PS), Polypropylene (PP), Polyvinylchloride (PVC), Polyamide (PA), Polyethylene (PE), Polyethylene-terephtalate (PET), Polytetrafluor-ethylene (PTFE), Polyoxymethylene (POM), Thermoplastic elastomers (TPE), thermoplastic polyurethane (TPU), Polyimide (PI), Polyether-ether-ketone (PEEK), Polylactic acid (PLA), polymethylpentene (PMP), and derivatives thereof, wherein said polymer is optionally filled with an inorganic material such as carbon black, oxides, such as $SiO_2$, $Al_2O_3$, $TiO_2$, $ZrO_2$, $Fe_2O_3$, in particular metal oxides, and semiconductors, such as ZnS, SdS, SdSe.

In one embodiment, one or both of said first substrate and said second substrate has a channel or groove or recess or hole in it, which, preferably, forms a conduit at the interface between said first and second glass-like surfaces, wherein more preferably, said conduit extends from one edge to another edge of said first or second substrate or from one hole of one of the substrates to another hole of one of said substrates, thus allowing the flow-through of a liquid through said conduit.

In one embodiment, the method according to the present invention is performed on said first polymeric substrate and on at least a second polymeric substrate made of a material according to the present invention and, optionally, on a third and/or further polymeric substrates, each being made of a material according to the present invention, wherein said first and second polymeric substrate and, if present, said third and further polymeric substrates are subsequently bonded to each other by the bonding step as defined further above.

In one embodiment, one, two or more of said polymeric substrates have a channel or groove or recess or hole, which forms a conduit at the interface between said substrates, wherein, preferably, said conduit extends from one edge to another edge of said substrate(s) or from one hole of one of the substrates to another hole of one of said substrates, thus allowing the flow-through of a liquid through said conduit.

The objects of the present invention are also solved by a method of manufacturing a chip, preferably, a microfluidic chip, said method comprising:

a) providing at least a first polymeric substrate, made of a material as defined further above, and a second substrate, said second substrate being either a solid substrate or a flexible foil and being made of a polymeric material as defined further above or of a material selected from glass, quartz, silicon nitride, and silicon oxide, or, if said second substrate is a flexible foil, being made of: polyolefines, polyethers, polyesters, polyamides, polyimides, polyvinylchlorides, polyacrylates; including their modifications, derivates, derivatives and copolymers; more specifically one of the list containing acrylnitril-butadien-styrole (ABS), cyclo-olefin-polymers and copolymers (COC/COP), Polymethylene-methacrylate (PMMA), Polycarbonate (PC), Polystyrole (PS), Polypropylene (PP), Polyvinylchloride (PVC), Polyamide (PA), Polyethylene (PE), Polyethylene-terephthalate (PET), Polytetrafluor-ethylene (PTFE), Polyoxymethylene (POM), Thermoplastic elastomers (TPE), thermoplastic polyurethane (TPU), Polyimide (PI), Polyether-ether-ketone (PEEK), Polylactic acid (PLA), polymethylpentene (PMP), wherein at least one of said first and said second substrate have a channel or recess or groove or hole in it; and either b1) performing the method according to the present invention on at least said first substrate, preferably on both said first and second substrate, and subsequently performing the bonding step as defined further above thereon; or b2) bringing said first and said second substrate in contact with each other and bonding them with each other by the bonding step as defined further above to form an assembly of said first and second substrate, and subsequently, performing the method of providing a polymeric substrate with a glass-like surface in accordance with the present invention on said assembly, in particular on the conduit(s) which is (are) formed inside said assembly.

In one embodiment, step a) includes providing a plurality of substrates, according to the present invention, and steps b1) or b2) are performed on said plurality of substrates, thus resulting in a chip comprising a plurality of substrates which are stacked on one another.

The objects of the present invention are also solved by a polymeric substrate produced by the method of providing a polymeric substrate with a glass-like surface according to the present invention.

The objects of the present invention are also solved by a chip, in particular a microfluidic chip, made of two substrates, at least one of which, preferably at least two of which are polymeric substrates in accordance with the present invention as defined further above, said chip having at least one conduit going through said chip, said conduit preferably having a smallest dimension being in the range <500 μm, preferably <200 μm.

In one embodiment, the chip according to the present invention is made of one polymeric substrate as defined further above according to the present invention and either a) another such polymeric substrate as defined further above according to the present invention, or b) another substrate which is a flexible foil as defined further above, or c) another substrate which is made of a material selected from glass, quartz, silicon nitride, and silicon oxide, or d) a plurality of substrates, wherein said plurality of substrates is composed of a plurality of substrates of the type defined in a) or b) or c), or is composed of a plurality of substrates of any combination of the types defined in a)-c).

In one embodiment, said at least one conduit is filled with a matrix suitable for the analysis and/or detection and/or separation and/or transport of analytes, preferably of biological cells, or biological macromolecules and/or their respective mono/oligomers, such as nucleic acids, nucleotides, proteins, peptides, amino acids, carbohydrates, polysaccharides, oligosaccharides, monosaccharides, lipids, fats, and fatty acids.

In one embodiment, said matrix is a gas phase, a liquid, a dispersion of solid particles in a liquid, or a gel, preferably a polyacrylamide gel or an agarose gel or a starch gel or a sucrose gel.

The objects of the present invention are also solved by a chip, in particular a microfluidic chip, produced by the method according to the present invention.

The objects of the present invention are also solved by a kit for manufacturing a chip, in particular a microfluidic chip, by the method according to the present invention, said kit comprising at least a first substrate and a second substrate, wherein at least one of said first and second substrate has a channel or recess or groove or hole in it, said kit further comprising one or several agents to perform the method according to the present invention on said substrates.

In one embodiment, said first and second substrate is made of a material selected from polymers of synthetic or natural origin, preferably injection-moldable polymers, more preferably one of the material classes containing: polyolefines, polyethers, polyesters, polyamides, polyimides, polyvinylchlorides, polyacrylates; including their modifications, derivates, derivatives and copolymers; more specifically one of the list containing acrylntiril-butadien-styrole (ABS), cyclo-olefin-polymers and copolymers (COC/COP), Polymethylene-methacrylate (PMMA), Polycarbonate (PC), Polystyrole (PS), Polypropylene (PP), Polyvinylchloride (PVC), Polyamide (PA), Polyethylene (PE), Polyethylene-terephtalate (PET), Polytetrafluorethylene (PTFE), Polyoxymethylene (POM), Thermoplastic elastomers (TPE), thermoplastic polyurethane (TPU), Polyimide (PI), Polyether-ether-ketone (PEEK), Polylactic acid (PLA), and polymethylpentene (PMP), and derivatives thereof, wherein said polymer is optionally filled with an inorganic material such as carbon black, oxides, such as $SiO_2$, $Al_2O_3$, $TiO_2$, $ZrO_2$, $Fe_2O_3$, in particular metal oxides, and semiconductors, such as ZnS, SdS, SdSe.

The objects of the present invention are also solved by a kit for the analysis and/or detection and/or separation and/or transport of analytes, preferably of biological macromolecules and their respective mono/oligomers, said kit comprising:

the chip according to the present invention, and, optionally, one or several agents, such as e.g. buffers, necessary for the analysis and/or detection and/or separation and/or transport of analytes.

The objects of the present invention are also solved by the use of a polymeric substrate or of a chip, in particular a microfluidic chip, according to the present invention in a method of analyzing, detecting, separating and/or transporting analytes, preferably biological cells, or biological macromolecules and/or their respective mono/oligomers, in particular in a method of electrophoresis, a method of sequencing, an assay method for the detection of an analyte, or a method of flow cytometry.

The term "assay", as used herein, is meant to refer to a procedure for testing or measuring the activity or presence of a drug or biochemical or molecule or substance in an organism or organic sample. A quantitative assay may also measure the amount of a substance in a sample. A qualitative assay may also detect the presence of a drug or biochemical or molecule or substance or organism. Bioassays and immunoassays are among the many varieties of specialized biochemical assays. Other assays measure processes such as enzyme activity, antigen capture, stem cell activity, gene expression, genotyping, DNA/RNA analysis and competitive protein binding, all of which assays are meant to be encompassed by the term "assay".

The objects of the present invention are also solved by a method for analysing, detecting, separating and/or transporting analytes, preferably biological macromolecules and/or their respective mono/oligomers, comprising:
  providing, in any order, a chip or polymeric substrate according to the present invention, and a sample containing analyte(s) to be analysed, separated and/or transported, said chip including a matrix as defined further above, said polymeric substrate having a matrix as defined further above attached,
  applying said sample to said matrix,
  applying a voltage to said matrix, said voltage being sufficient to cause the migration or diffusion or flow of the analyte(s) through said matrix,
  irradiating or ablating or desorbing or ionising the analyte(s), and, optionally, further
  analysing the analyte(s).

The objects of the present invention are also solved by the use of a substrate according to the present invention for manufacturing a chip, in particular a microfluidic chip, for the analysis and/or separation and/or transport of analytes.

The term "etched-glass-like", as used herein, is meant to refer to a surface which mimics the surface of etched-glass, in one of the aforementioned characteristics, without, however, necessarily having been etched before. The process of etching glass is well known to a person skilled in the field, as is the resultant glass-product of such process, which is known to be characterized by an increased surface roughness and other characteristics, mentioned above, in comparison to untreated, i.e. non-etched glass. The term "thin film" as used herein, refers to a film or layer having a thickness in the range from 0.1 nm to 1 μm, more preferably 1 nm to 100 nm.

The term "glass-like", as used herein, is meant to refer to a surface which mimics the surface of glass, in one of the aforementioned characteristics, without, however, being a glass-surface. In one embodiment, such glass-like surface is formed by a polymer.

The term "$SiO_x$", or "silicon oxide" as used herein, is meant to refer to any form of silicon oxide, including, but not limited to all crystalline forms, polycrystalline forms, and/or amorphous forms, of silicon oxide, with varying amounts of oxygen present, and also including incompletely converted forms of $SiO_x$-precursor which may include organic groups. The term "$SiO_x$" also includes $SiO_2$ and SiO, without being limited thereto. In one embodiment, the variable "x" is in the range of from 1 to 2 and also includes non-integer values.

The term "increased", as used herein in combination with "porosity", "roughness" or another quality is meant to refer to such quality being larger in comparison to an untreated substrate.

In one embodiment, said $SiO_x$-precursor is dissolved in a solvent or is present in sol-gel form when being coated in step b2).

In one embodiment, the method according to the present invention is performed on a first polymeric substrate and a second polymeric substrate or on a plurality of polymeric substrates, and wherein said first substrate and said second substrate thereby are provided with a first and second glass-like or etched-glass-like surface, respectively, said method further comprising the step:
  bringing said first and said second glass-like or etched-glass-like surface in contact with each other by pressing said first and second substrate together, preferably by a pressure in the range from 0.2 to 5 N/mm$^2$, more preferably in the range from 0.5 to 1 N/mm$^2$, for a time in the range from 10 to 600 s, more preferably in the range from 30 to 120 s, and by exposing said first and second substrate to a temperature in the range of from 40° C. to 200° C., preferably 60° C. to 80° C. and/or exposing said substrates to a vapour of a solvent immediately before pressing to increase their bonding to each other. It should be noted that the above mentioned first and second glass-like or etched-glass-like surfaces may also be part of a plurality of polymeric substrates and there are further glass-like or etched-glass like surfaces obtained thereby. These may also be subsequently brought in contact with one another and thus bonded to one another. This may for example result in a multiple stacks chip. The present invention also encompasses a structure where the method according to the invention is performed on one first polymeric substrate, and on a second polymeric laminar foil. These may also be subsequently be brought in contact with one another and thus bonded to one another. This may for example result in a laminar type chip. The present invention also encompasses a structure where the method according to the invention is performed on one polymeric substrate, and the surface obtained thereby is subsequently bonded to a surface of a e.g. glass-substrate or a quartz substrate etc. In this manner the production of hybrid structures, i.e. a glass substrate bonded to a polymeric substrate, becomes also possible.

It should be noted that one of said first and second substrates is a polymeric substrate as defined further above, and, in one embodiment, the other substrate is also a polymeric substrate. In another embodiment, the other substrate is a polymeric foil; in yet a further embodiment, the other substrate is a glass substrate or a quartz substrate, as an example.

The term "kit", as used herein, is meant to refer to an assembly of parts allowing the manufacture or use of a chip as defined above. In its simplest form, this kit comprises one or several agents to perform the method of providing a polymeric substrate with a glass-like surface, in particular an etched-glass-like surface according to the present invention, or to perform an analysis, detection separation and/or transport of analytes. In one embodiment, that kit may also additionally comprise at least one polymeric substrate, as defined further above. In one embodiment, said kit comprises, in addition to said at least one polymeric substrate, a further polymeric substrate as defined above, or a polymeric foil or a glass substrate.

The objects of the present invention are also solved by the use of a substrate as defined above for manufacturing a chip, in particular a microfluidic chip.

The term "chip", as used herein, is meant to refer to a device comprising at least one substrate which allows for the accommodation and/or the transport of a sample, preferably a liquid sample. Such accommodation or transport of a sample may for example be achieved in that such substrate comprises a well and/or channel and/or groove and/or recess or it may comprise a conduit. In one embodiment, the chip comprises at least one well. Such well may, for example, accommodate a liquid sample, or it may accommodate a solid sample, such as particles, in particular microparticles, which may be covered with a ligand, e.g. an antigen.

The term "microfluidic chip", as used herein, typically refers to such chip in the aforementioned sense, wherein, however, the dimensions of at least some of the wells, channels, grooves, recesses or conduits etc. are on the micrometer range.

In one embodiment, the term "glass-like", as used herein in the context of a substrate, is meant to refer to a scenario wherein such substrate, in particular the surface of such substrate, mimics one or several properties of glass, in particular the chemical content (Si, O) and composition, homogeneity, roughness (<3 nm RMS), porosity, hydrophilicity (water contact angle <50° for cleaned glass), surface energy and adsorption affinity, surface functionality, chemical and physical surface reactivity, and surface charge (Zeta potential <0 V for pH >2, preferably for pH >3), ion-exchange capability, proton conduction in solution due to formation of water channels inside the substrate, high inner surface, preferably >100 $m^2g^{-1}$, more preferably >500 $m^2 g^{-1}$, high permeation of gases, without being limited thereto and without necessarily having been etched itself The term "an etched glass-like", as used herein in the context of a substrate, is meant to refer to a scenario wherein such substrate, in particular the surface of such substrate, mimics one or several properties of etched glass, in particular the chemical content (Si, O) and composition, homogeneity, roughness (>3 nm RMS), porosity, hydrophilicity (water contact angle <50° for cleaned glass), surface energy and adsorption affinity, surface functionality, chemical and physical surface reactivity, and surface charge (Zeta potential <0 V for pH >2, preferably for pH >3), ion-exchange capability, proton conduction in solution due to formation of water channels inside the substrate, high inner surface, preferably >100 $m^2g^{-1}$, more preferably >500 $m^2g^{-1}$, high permeation of gases, without being limited thereto, and without necessarily having been etched itself.

The term "biological macromolecule", as used herein, is meant to refer to macromolecules that typically occur in living matter and organisms, for example nucleic acids, proteins, peptides, carbohydrates, polysaccharides, lipids, and fats. Their respective mono/oligomers are the corresponding nucleotides, peptides, amino acids, sugars, fatty acids in their respective mono/oligomeric forms. Also encompassed by the term "biological macromolecule", as used herein, are macromolecular assemblies, such as viruses, cell organelles, ribosomes, mitochondria, chromosomes and other comparable structures. The substrates and chips according to the present invention find use in the analysis, detection, separation, and/or transport of any of the foregoing.

The present inventors have surprisingly found that it is possible to combine the positive qualities of polymeric substrates with the positive characteristics of glass surfaces, in particular etched-glass-surfaces by endowing such polymeric substrates with a glass-like surface, in particular an etched-glass-like surface. Preferably, the polymeric substrate is a carbon-polymer-based substrate. In one embodiment, the substrate is not polydimethylsiloxane.

In a preferred embodiment, the polymeric substrates in accordance with the present invention have a zeta potential which is negative, i.e. <0V for pH >2, more preferably >3. If one measures the zeta potential in dependency on the pH, the measured values for the polymeric substrates in accordance with the present invention are comparable to the respective potentials measured with glass or etched glass. In some embodiments, the zeta potential of the substrates in accordance with the present invention is more negative than a glass surface.

Furthermore, the polymeric substrates in accordance with the present invention show the same behaviour as glass, when in contact with SDS, as measured, for example by the respective zeta potential. In one embodiment, the zeta potential of the polymeric substrate in accordance with the present invention is not substantially affected by the presence of SDS. This is in contrast to polymeric substrates not according to the present invention, where the zeta potential can be altered drastically by the presence of SDS. Preferably, the substrates in accordance with the present invention have a zeta potential <0 at a pH of 3 or more, and the presence of SDS shifts the zeta potential to no more than twice as negative values as the zeta potential in the absence of SDS.

In one embodiment, the surface of the polymeric substrate is coated with $SiO_2$ by means of thermal deposition, heated electrically or by an electron-gun, or by sputtering. In another embodiment, a $SiO_2$-precursor, such as TEOS, OTCS or TTBS-OH or perhydropolysilazane is applied to the surface of the polymeric substrate and subsequently converted into $SiO_2$ by appropriate post treatments, such as annealing, irradiating with energetic electromagnetic radiation, such as UV or treatment with water or base or acid or combinations thereof. In doing so, the polymeric substrate is endowed with a surface that has a characteristic, such as chemical composition that mimics the surface of glass or etched glass. Such substrate is amenable to bonding with other substrates or laminar foils, e.g. such substrates which have been treated in the same manner. Such substrate endowed with a surface that has a characteristic mimicking the surface of glass or etched glass is, however, also amenable to bonding with other substrates not treated according to the present invention.

The term "polymer or coating material having intrinsic porosity", as used herein, is meant to refer to a polymer or coating material which by its nature is porous and has a high inner surface. Preferably, the dimensions of the pores are in the range of 0.5 nm to 50 nm, preferably in the range of 1 nm to 10 nm and the inner surface is larger than 100 $m^2 g^{-1}$. If a polymeric substrate is provided with a surface of such a polymer having intrinsic porosity, the morphology, in particular the porosity of a glass or an etched glass-surface, is mimicked. The term "polymer or coating material having increased roughness", as used herein, is meant to refer to a polymer which by its nature has a relatively high RMS surface roughness after its deposition as a thin film. Preferably, the RMS surface roughness is in the range of 0.1 nm to 1 μm, preferably in the range of 1 nm to 100 nm, as measured by AFM with standard AFM tips. The term "increased roughness", as used in this context is meant to refer to a roughness that is increased in comparison to the uncoated or not treated surface of a substrate.

The various embodiments of providing a glass-like or an etched glass-like surface may also be combined in a sense that both the chemical composition as well as the morphology and roughness of glass or etched glass is mimicked thereby.

The substrates in accordance with the present invention have a long time stability, as for example measured by their respective contact angle. For example, in one embodiment, the contact angle of a substrate surface treated in accordance with the present invention stays below 50 degrees for a period of up to 60 days and more. This makes the substrates in accordance with the present invention amenable to a use in industrial processes and repeated uses.

The inventors have also found that, after two substrates have been treated in the aforementioned manner in accordance with the present invention, they may be bonded together, thus forming an assembly of two substrates having an interface. If at least one of these substrates encompasses a channel or groove or recess and is contacted with another substrate or foil, such channel or groove or recess will form a conduit in the assembly of the two substrates. By choosing appropriate extensions of the channel in one of the substrates, for example by having the channel extend from one end of the substrate to another end, an appropriate conduit can be formed which allows the flow-through of liquid through the assembly. In this manner, fluidic chips can be produced, in particular microfluidic chips. The term "microfluidic chip", or "microchip" as used herein, is meant to refer to a chip which has one or several conduits extending there through, which conduits allow the flow-through of liquid or gel or a polymer dye matrix. Preferably, such conduits preferably have a width in the range of 10 µm-200 µm, and a depth in the range of 1 µm-100 µm. Additionally, there may also be larger structures on/in that chip, such as reservoirs for liquids etc. The term "conduit", as used herein, is meant to refer to a hollow structure at an interface between two substrates through which a liquid can flow. A conduit is formed by a channel or recess or groove in at least one of the substrates. Thus, the term "channel", "groove", or "recess" refers to a hollow structure on the surface of a single substrate. If such surface is then subsequently contacted with another substrate or foil and is effectively thereby covered, a conduit is formed. Sometimes, a substrate having a channel or recess or groove in it is herein also referred to as a channel plate. The substrate that covers such channel plate is also herein sometimes referred to as a cover plate or well plate (if it has holes on the surface, not the edge, as an entrance for the analyte). In accordance with embodiments of the present invention, a chip or microfluidic chip may thus for example be formed by two substrates being bonded together or laminated, wherein at the interface, a conduit is formed by one or several channels on at least one of the substrates. Such substrates together are also herein sometimes referred to as an "assembly of substrates". In such assembly of substrates, the two substrates are interfacing each other with their respective glass-like or etched glass-like surfaces.

The order of the manufacturing steps for microchips may be either, first, surface treatment of one or both substrates and/or foil, and subsequent bonding, or the other way around, or a combination of the two, i.e., some parts of the treatment before bonding, others after.

Polymeric substrate materials are commercially available from various manufacturers. Examples of suitable materials are:

Trogamid CX7323®, PMMG CMG302®, Delpet 70NH, Zeonor 1060R®, Zeonex® 480, PC black Makrolon® 2405, Arton® D4540, Zeonor® 1060R+2% black, PP Dow H734-52®, TPX®, PC®, PP®, Topas® 8007X11, PC-MEP®, PC-Dow®.

In accordance with the present invention, glass-like or etched-glass-like properties on polymeric substrates are achieved by appropriate coatings or surface modifications. This allows the manufacture and use of microchips made of such polymeric substrates without further needs to change the experimental protocols for their respective applications as compared to glass microchips, i.e. they can be used as direct substitution. Moreover, it is possible to fine-tune the coating properties by controlling the interface and the interaction of biomolecules at/with the interface of the polymer substrate.

The coatings and surface modifications in accordance with the present invention are permanent and stable over time and they are easily integrated in production processes, since they are not labor-intense. In one embodiment, the thicknesses of the layers of coatings can be varied. In one embodiment, the thickness of a coating layer is homogenous and is in the range of from 0.1 nm to 500 nm, preferably 5 nm to 200 nm. Such manufacture of surface layers having a thickness in the afore-mentioned ranges is of crucial importance in microfluidic applications, since their respective conduits for flow-through of liquid or gel are in the micrometer range. Consequently, the surface-modifying layers must be much thinner than the channel height.

The method in accordance with the present invention allows the easy production of disposable substrates and chips. Moreover, the substrates and chips produced in accordance with the present invention are compatible with existing experimental protocols for glass chips and methods for mass-production.

In the following, reference is made to the figures, wherein

FIG. 1 shows transmission curves of (a) $SiO_2$-layers of different thickness evaporated on Zeonor 1060R and (b) Zeonor 1060R and glass as reference. The transparency is not strongly dependant on layer thickness (5 nm to 100 nm), FIG. 2 shows results of durability tests of $SiO_2$ layer on Zeonor 1060R deposited with different methods. The contact angle is more stable on low value in the case of E-gun deposition.

Figure 6:
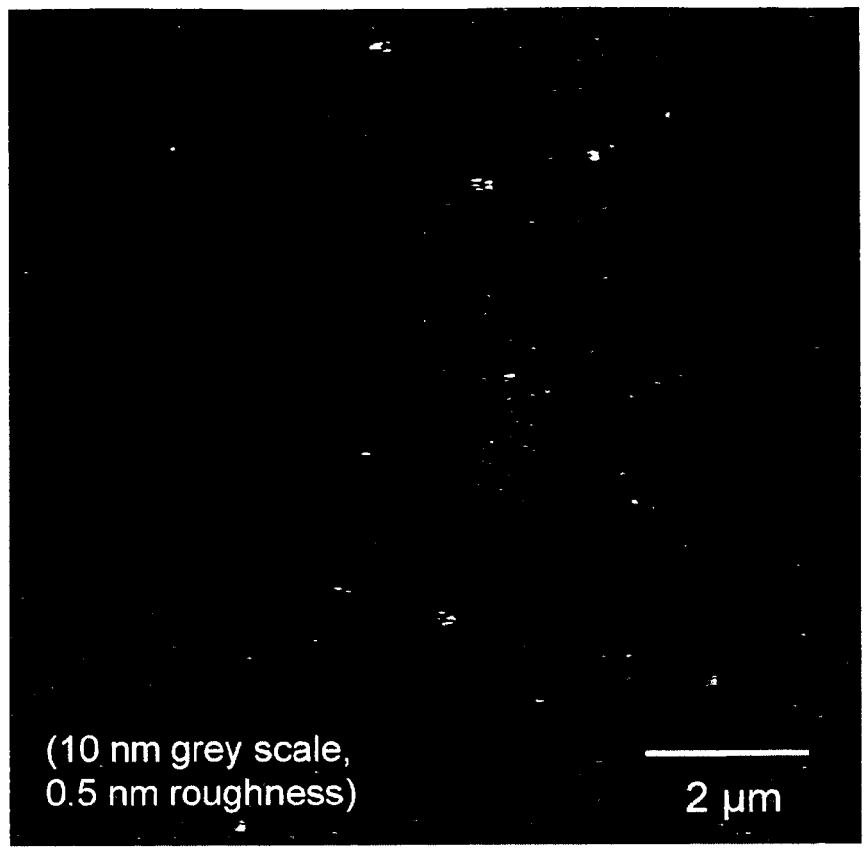
Figure 7:
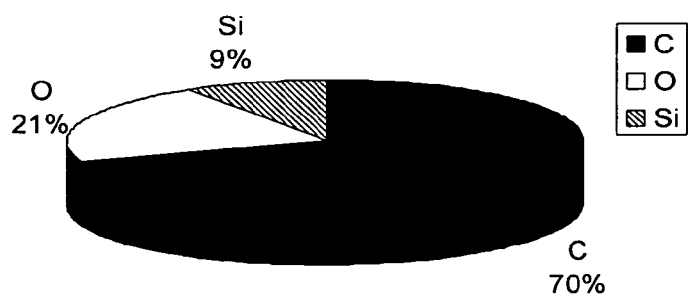
Figure 8:
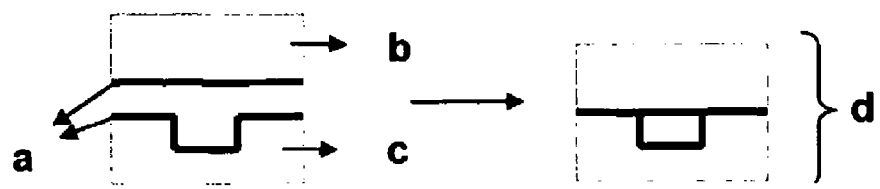

FIG. 6 shows an AFM image (topography) of a polymeric substrate coated with TEOS in accordance with the present invention; the surface roughness is ≤0.5 nm, illustrating a homogeneous coating, FIG. 7 shows the results of XPS to confirm the presence of $SiO_2$ which has been silanized with TEOS on the substrate surface, FIG. 8 shows a bonding scheme of a well plate b and a channel plate c, both plates having been coated a in accordance with the present invention and comprising a glass-like and/or an etched-glass-like surface. The result is a bonded chip d.

Figure 9:
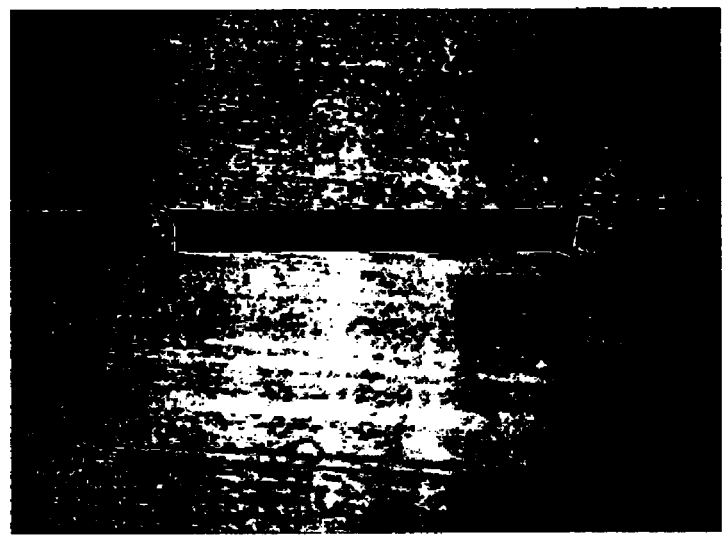

FIG. 9 shows an optical microscope image of a cross section of a bonded conduit formed by two substrates that have been treated in accordance with the present invention and have been provided with a glass-like, in particular an etched-glass-like surface; there is no deformation of the structure that can be seen in the optical microscope image, hence, the dimensions of the channel/conduit do not change upon coating and bonding.

Figure 10:
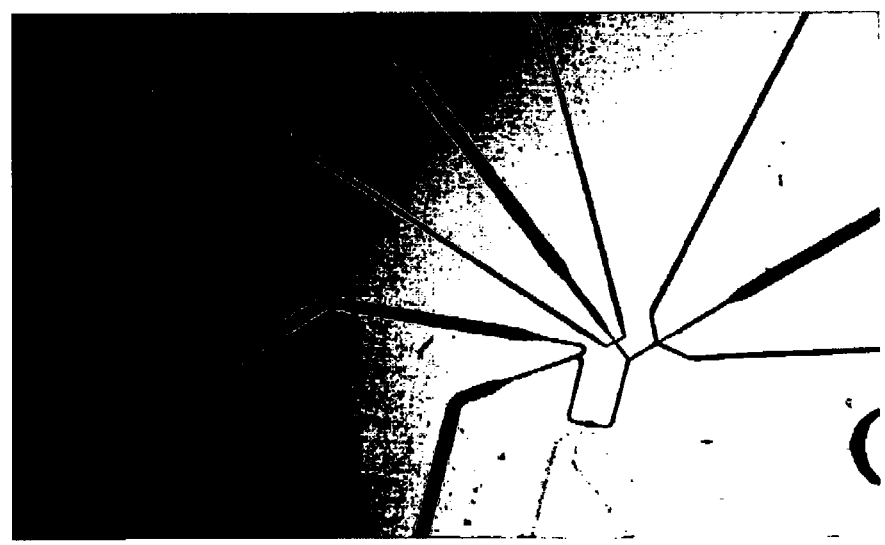
Figure 11:
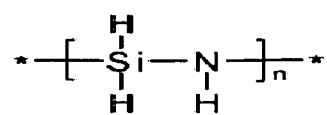
Figure 12:
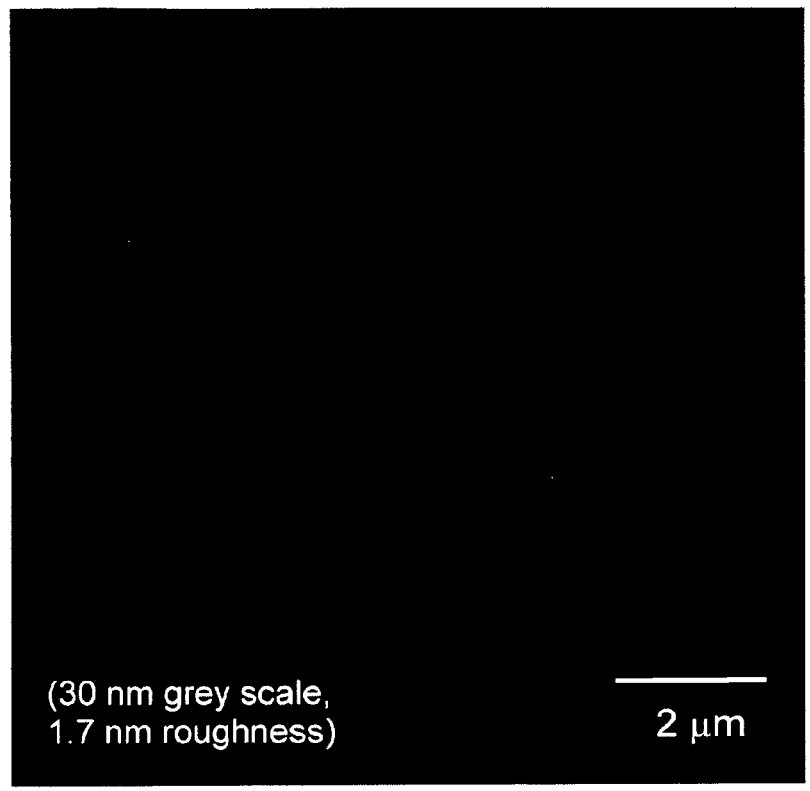
Figure 13:
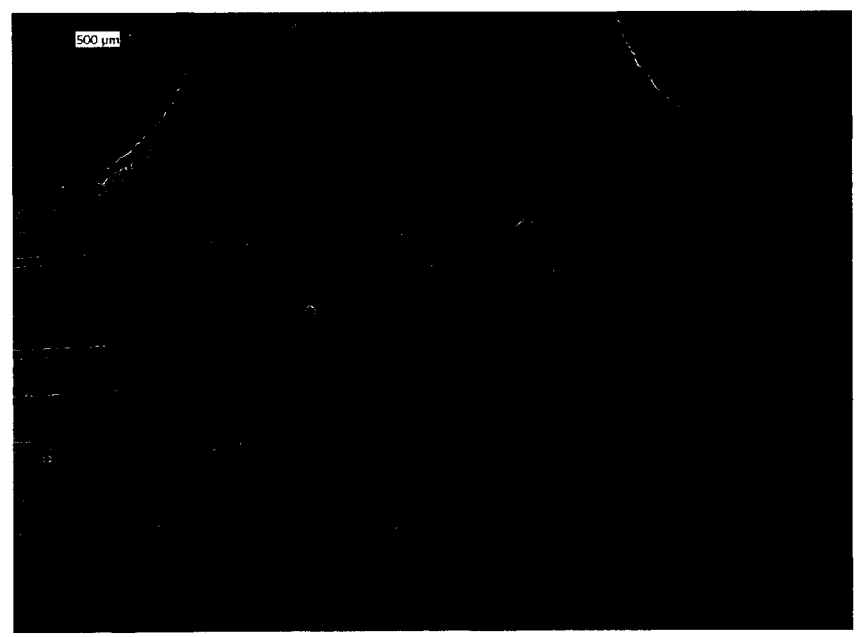
Figure 14:
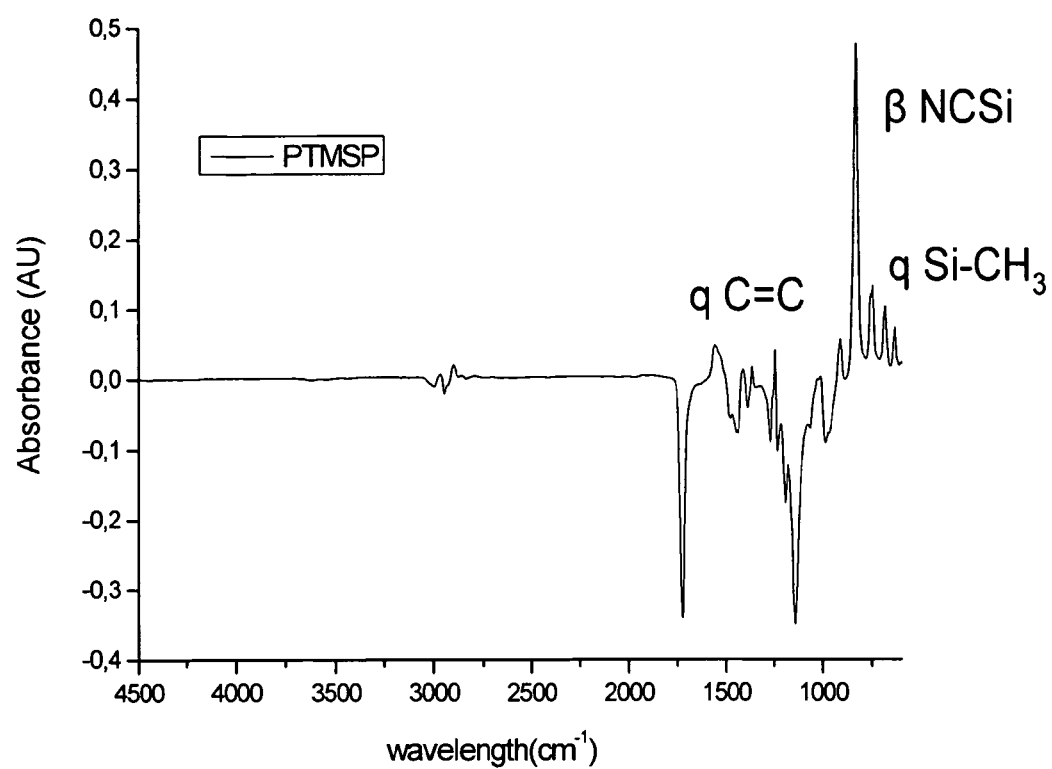
Figure 15:
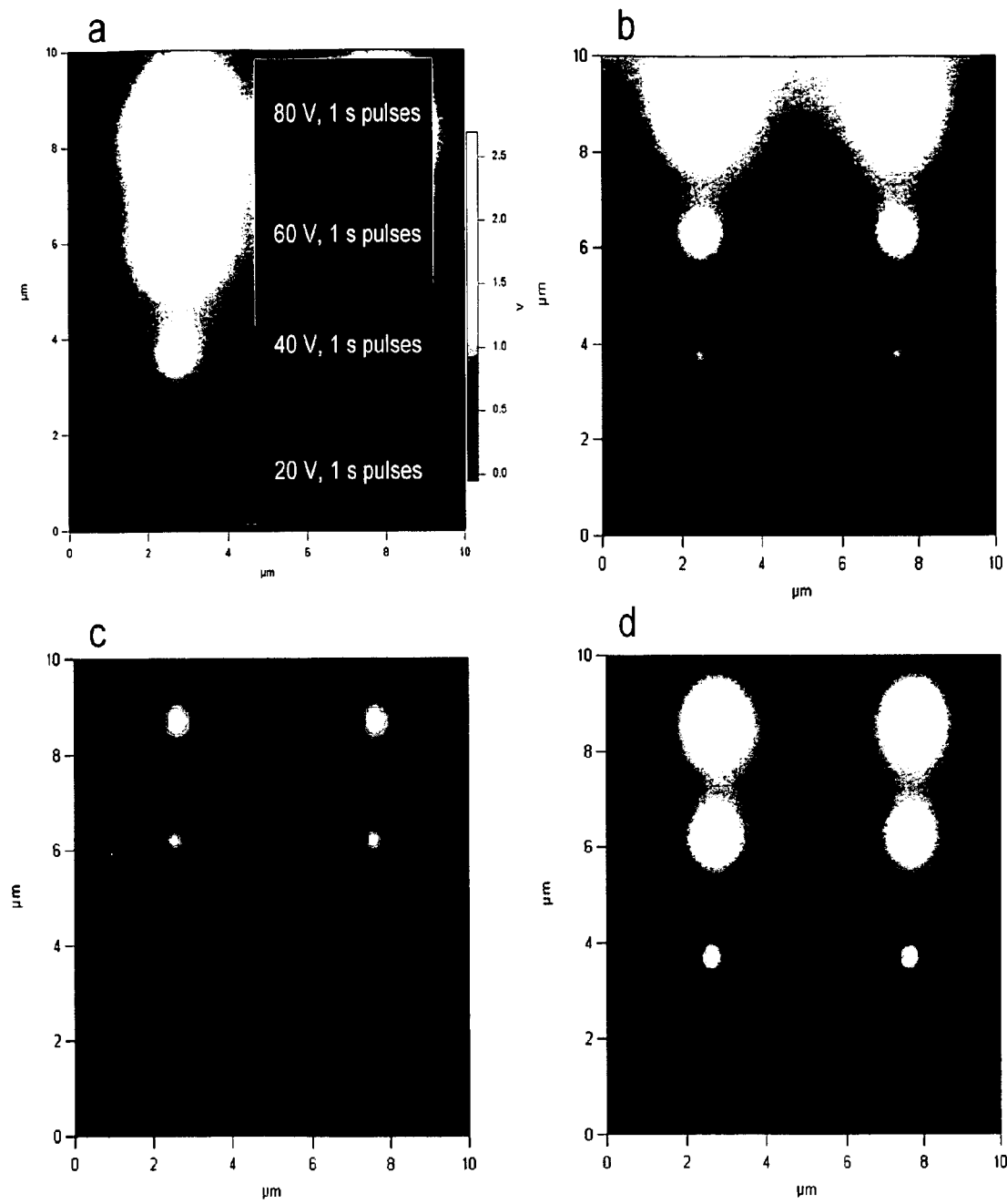
Figure 16:
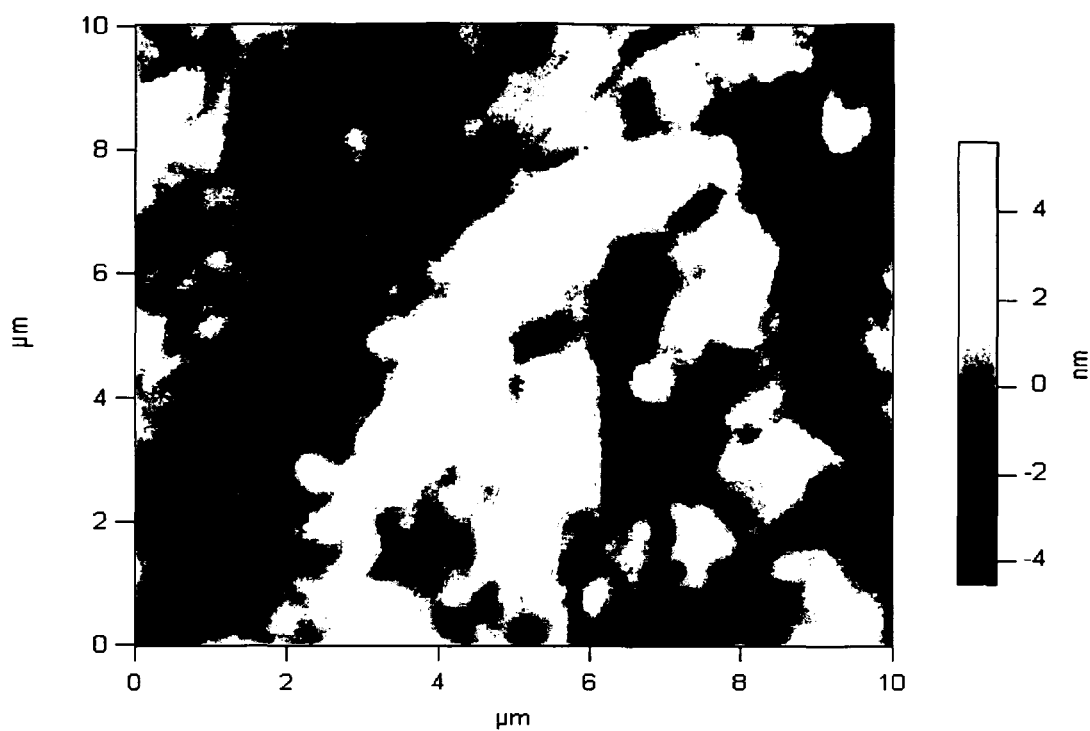
Figure 16:
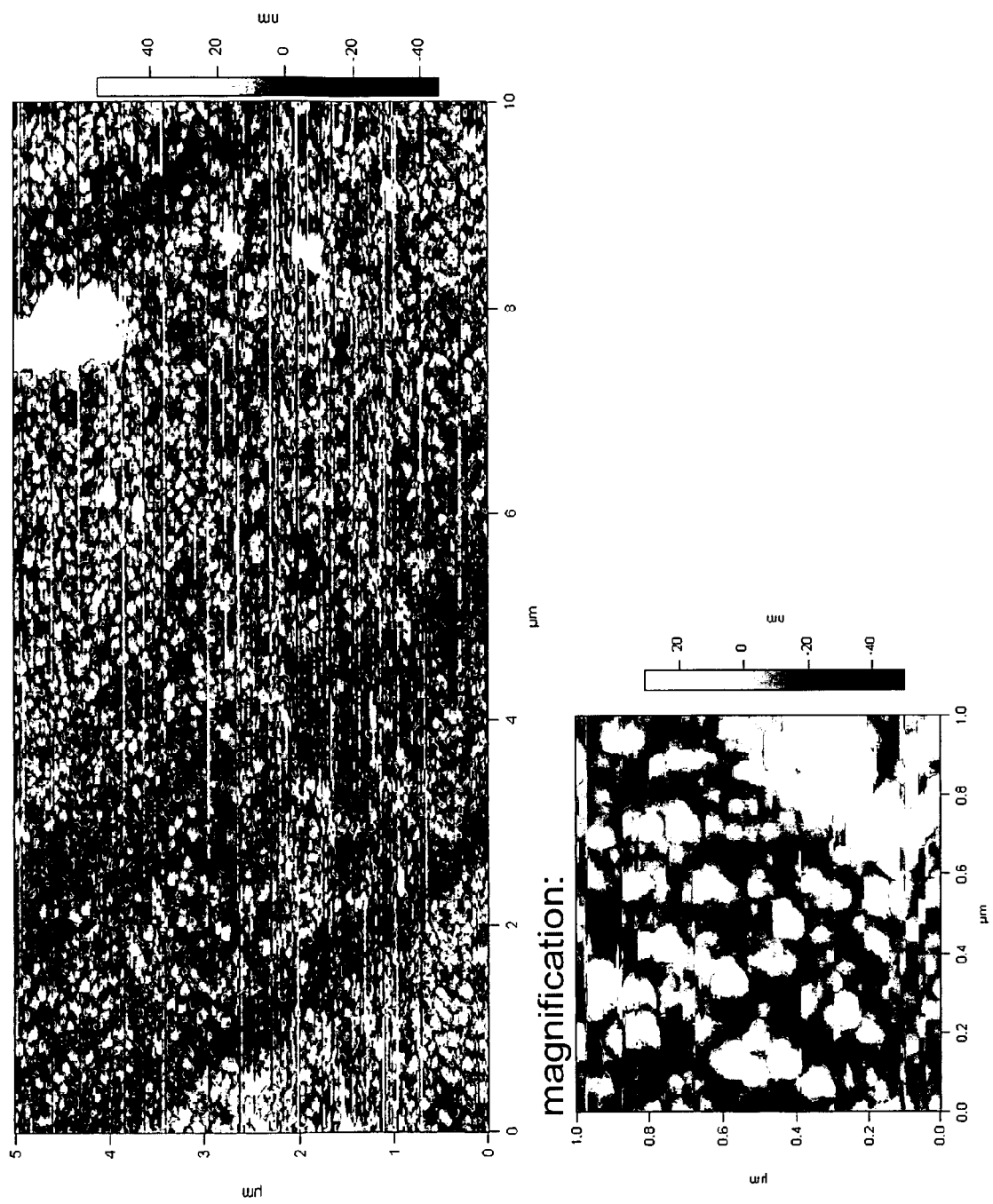
Figure 17:
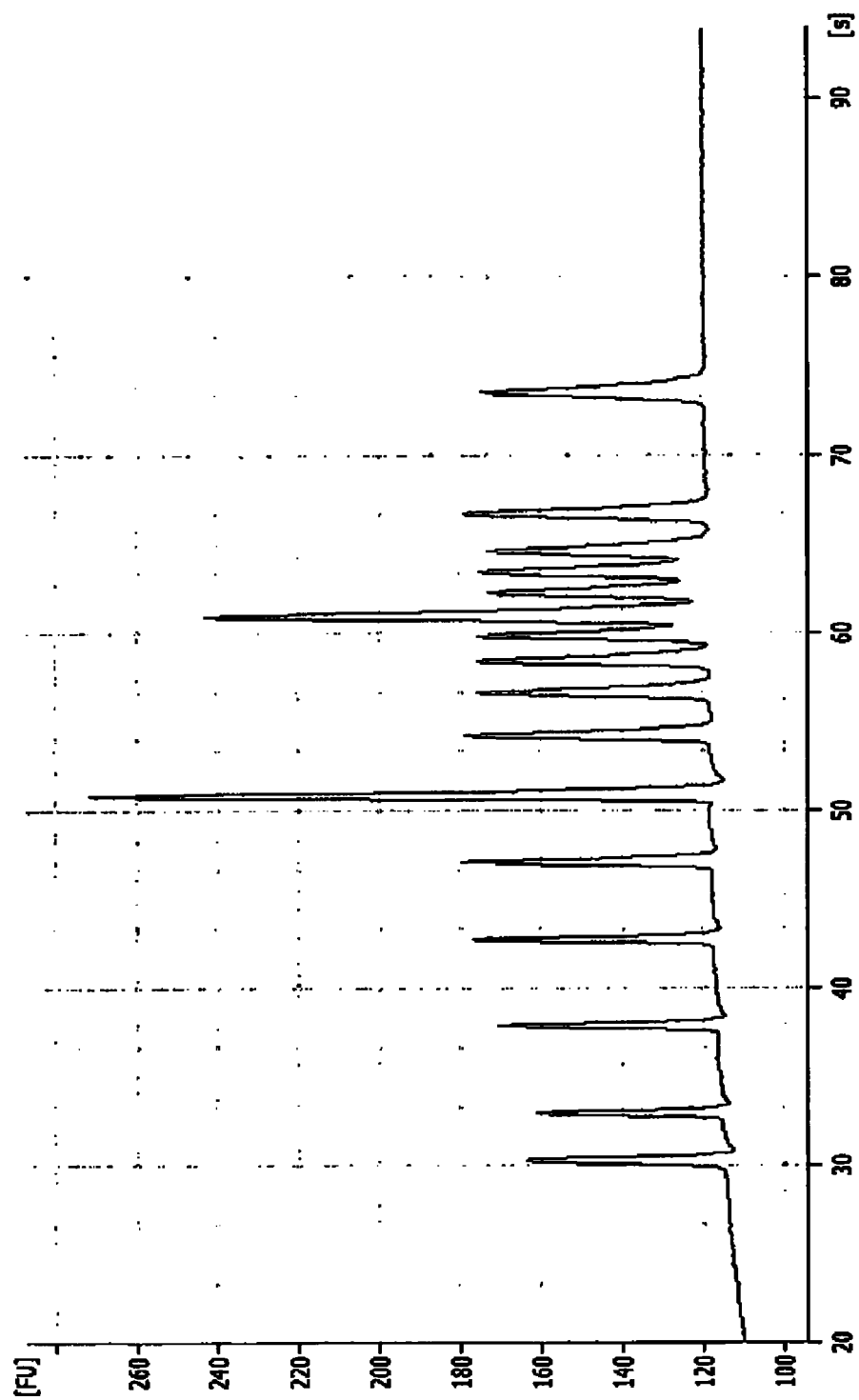
Figure 17:
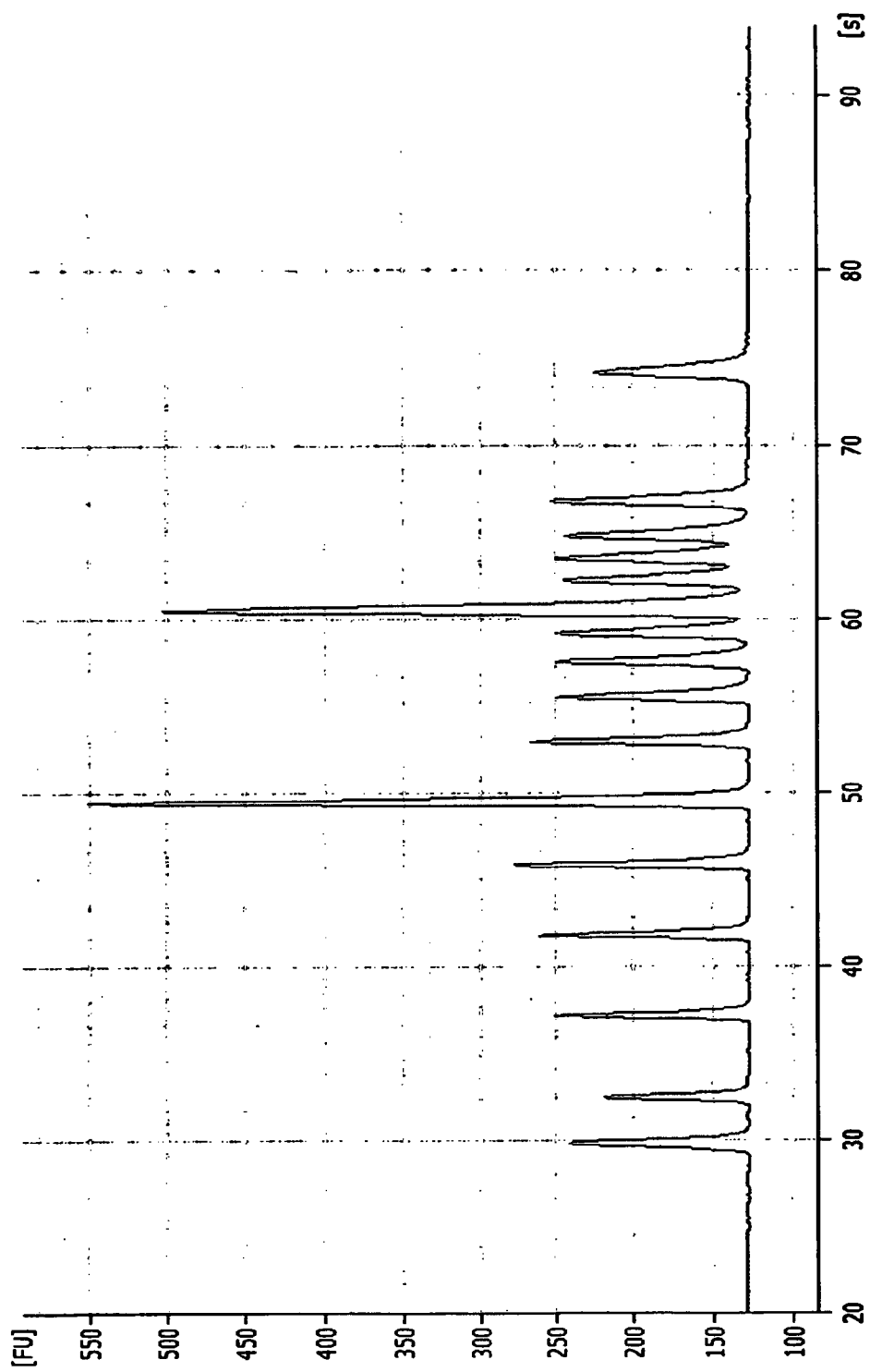
Figure 18:
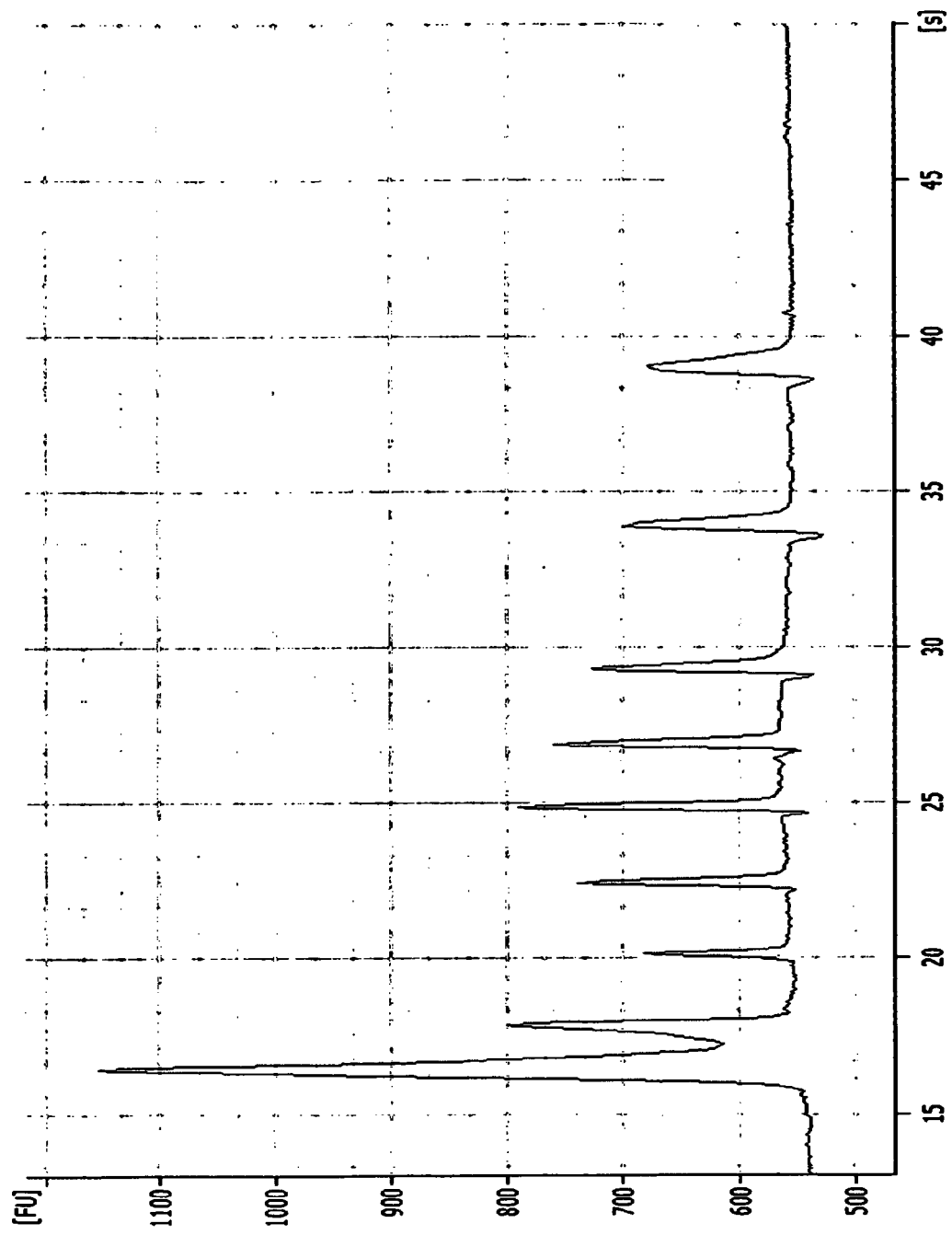
Figure 18:
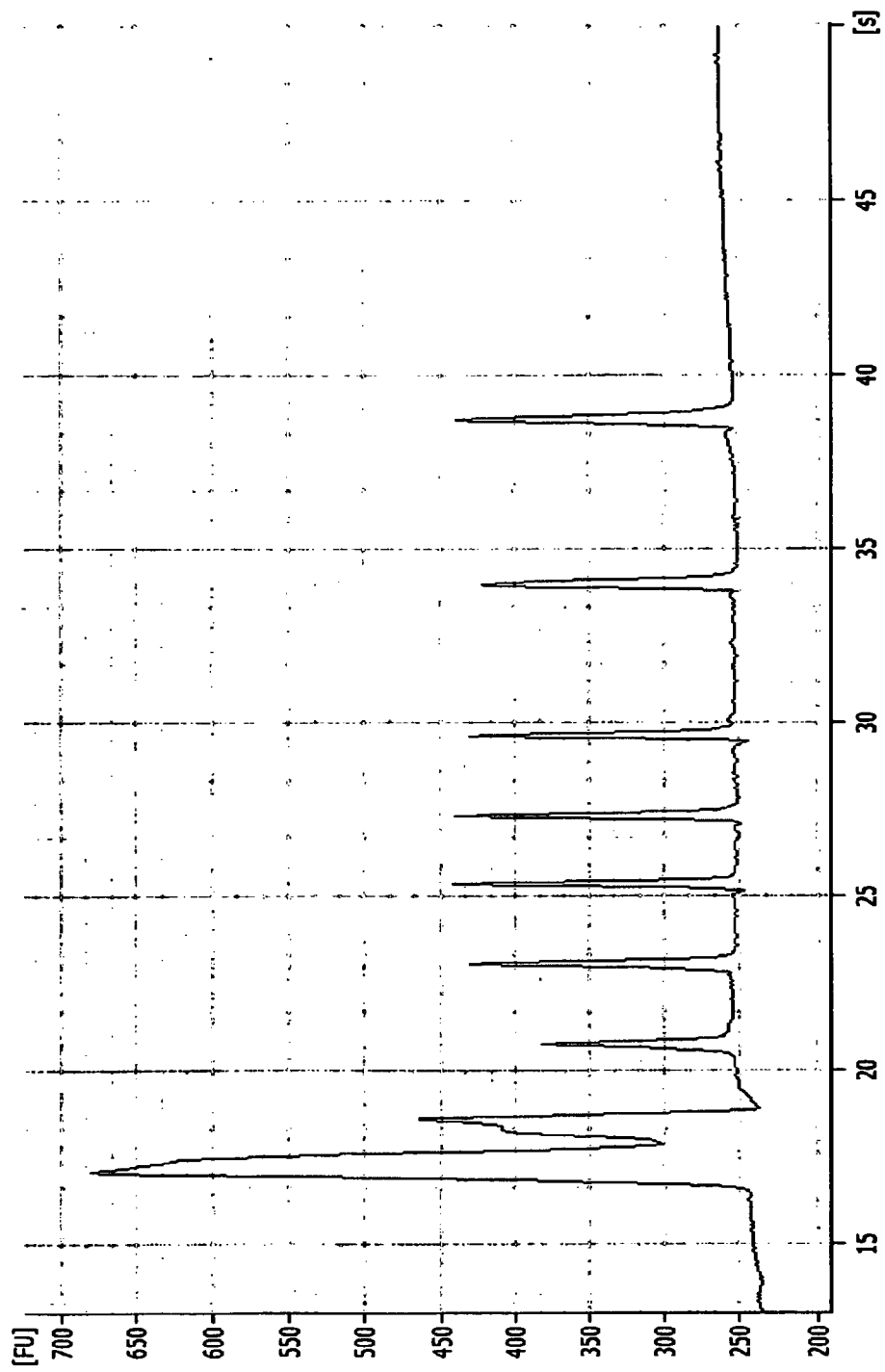

FIG. 10 shows an optical microscope image of conduits formed via bonding of two substrates comprising surfaces treated in accordance with the present invention. The channels are filled with a liquid of dark color. No leakages of the liquid can be discerned, FIG. 11 shows the structure of a liquid precursor, perhydropolysilazane, FIG. 12 shows an AFM-image of a substrate coated with perhydropolysilazane after $NH_4OH$ vapor treatment, indicating a homogeneous coating, FIG. 13 shows an optical microscope image of conduits coated with perhydropolysilazane and treated with $NH_4OH$ vapor. The coating does not change the dimensions of the conduits on a μm scale, FIG. 14 shows a FTIR absorption spectrum of a COC substrate coated with poly[1-(trimethylsilyl)-1-propyne] (PTMSP), the COC background spectrum has been subtracted; the presence of the coating is identified by the characteristic presence of absorption of chemical groups of PTMSP, FIG. 15 shows Kelvin probe force microscopy scans of (a) PTMSP film, (b) glass, (c) COC, and (d) COC coated with polysilazane, charged by 1 s voltage pulses applied to standard conducting AFM probe in contact to the samples. The strong charging (white spots) in (a) and (d) indicates, that water ions can penetrate into the volume of the films, similar to the charging observed on the glass film (b). The uncoated COC film (c) is not charged strongly, FIG. 16 shows AFM topography images of a untreated PMMA substrate (a), and after $Ar/O_2$ plasma treatment (b); the surface roughness increases significantly upon plasma treatment (from 4 nm to 25 nm RMS). The receding water contact angle on (b) is much lower (<10°) than the advancing contact angle (50°), indicating strong roughness, FIG. 17 shows an electrophoretic separation of DNA 7500 analyte obtained with a PMMA chip in accordance with the present invention (a) and the results of an electrophoretic separation using a conventional glass chip for comparison (b), FIG. 18 shows an electrophoretic separation of Bovine Serum Albumine analyte obtained with COC chips which is wet-coated with $SiO_2$ sol-gel in accordance to the present invention (a) and an electrophoretic separation using a conventional glass chip for comparison (b).

Figure 19:
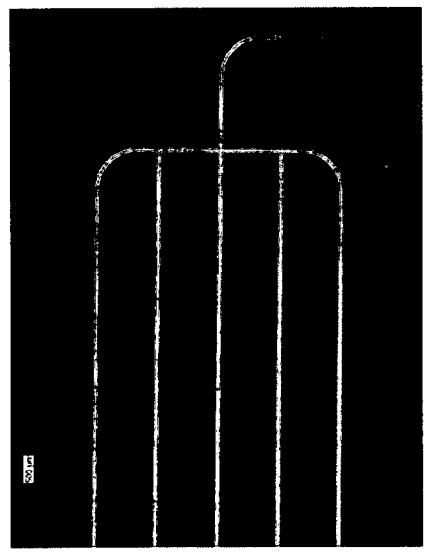

FIG. 19 shows an optical microscope image of conduits treated with Ar/O2 plasma. The treatment allows a successful bonding.

Figure 20:

FIG. 20 shows an optical microscope image of conduits treated with Ar plasma/UV-Ozone cleaner treatment. The treatment allow a successful bonding.

Figure 21:
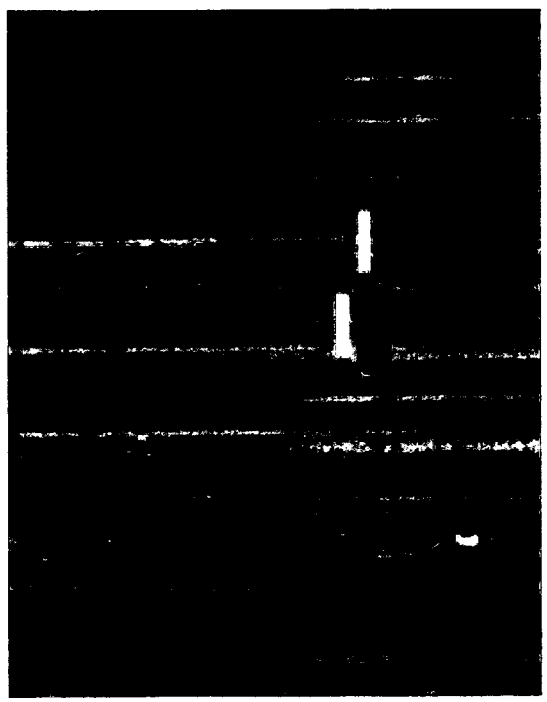
Figure 21:
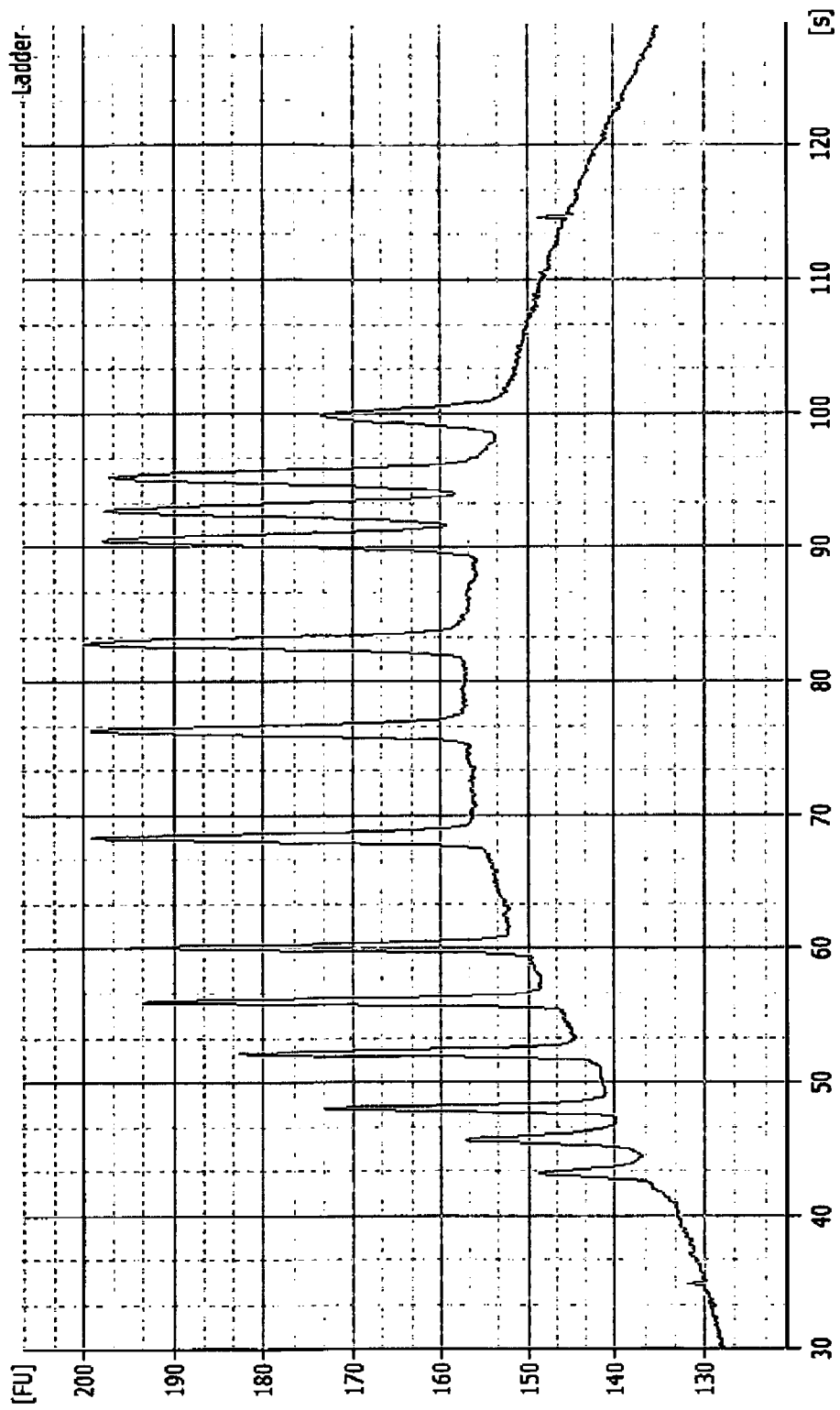

FIG. 21 shows an (a) optical microscope image of a cross section of a COP bonded conduit formed by two substrates that have been treated with Ar plasma/UV-Ozone cleaner, there is no deformation of the structure that can be seen in the optical microscope image, hence, the dimensions of the channel/conduit do not change upon treatment and bonding. FIG. 21(b) shows an electrophoretic separation of DNA 7500 analyte obtained with a COP chip treated with Ar plasma/UV-Ozone cleaner.

Figure 22:
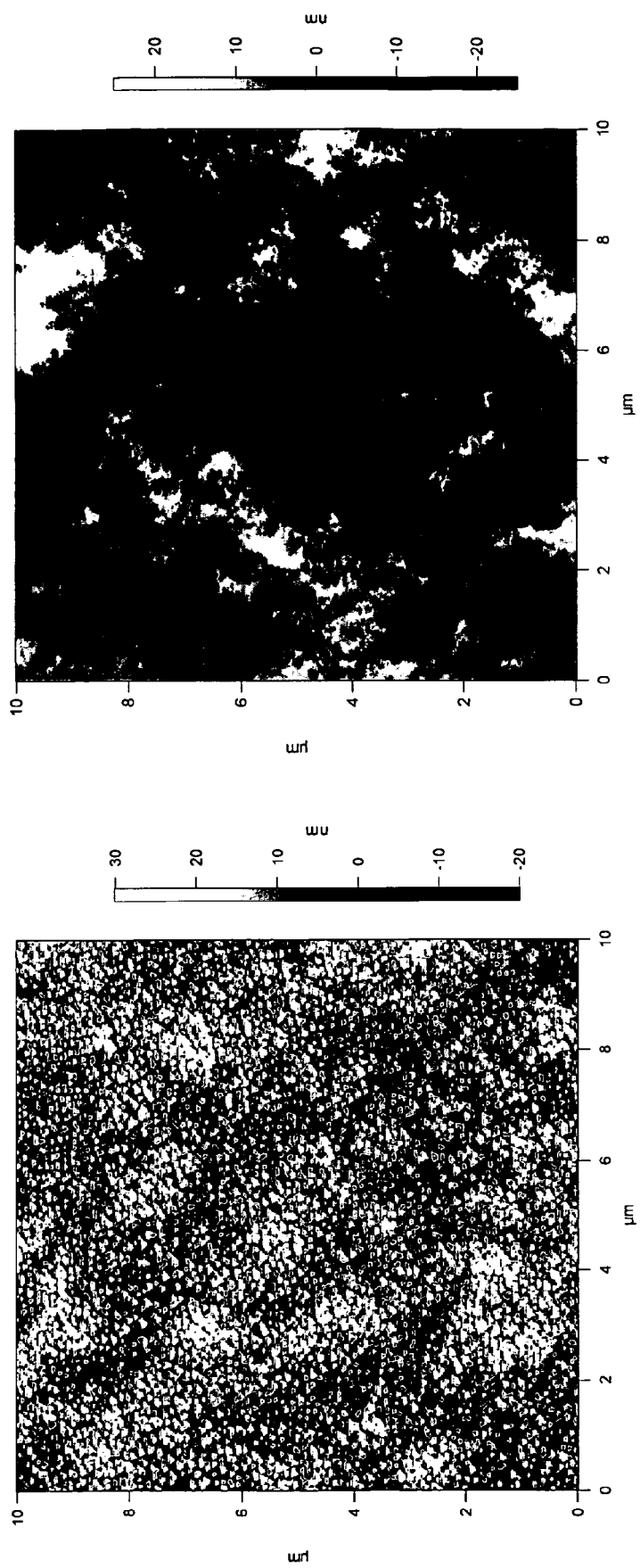

FIG. 22 shows AFM topography scans of (a) Ar plasma/UV-Ozone cleaner treatment on PMMA and (b) on COP; the surface roughness increases significantly upon plasma treatment to (a) 16 nm rms roughness, and (b), to 7 nm rms roughness.

Figure 23:
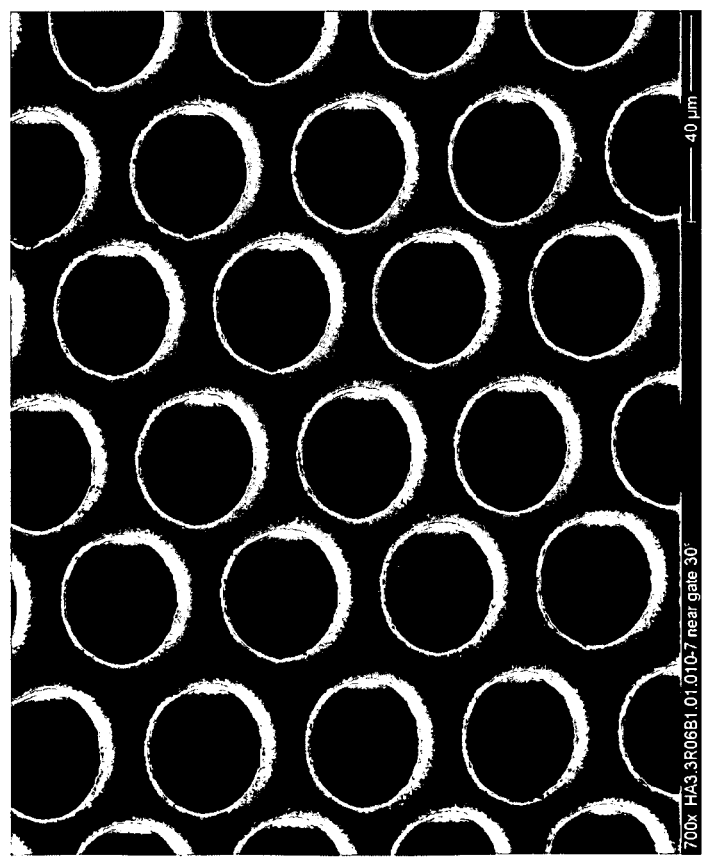

FIG. 23 shows an SEM image of a COP assay substrate

Figure 24:
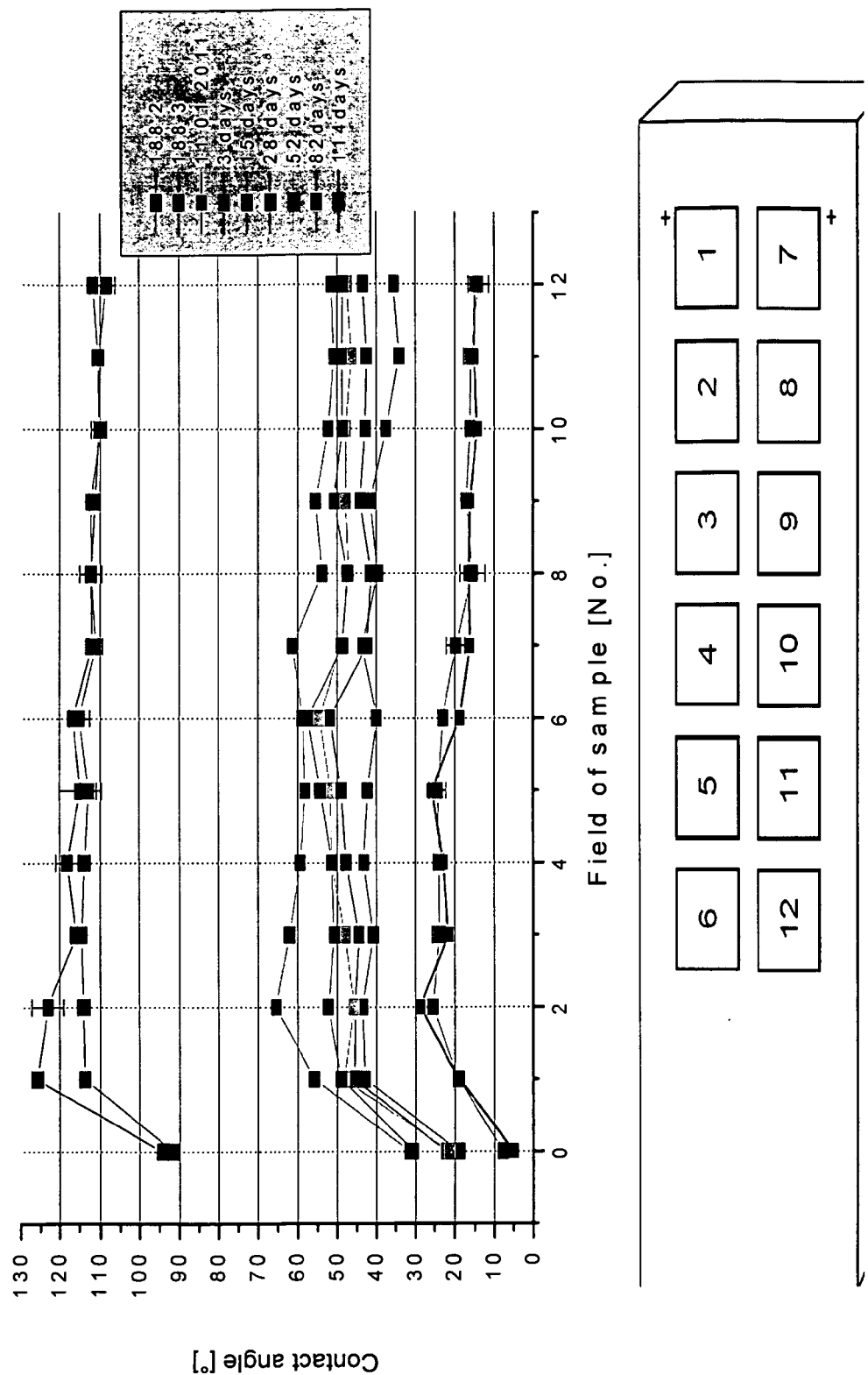

FIG. 24 shows contact angle measured in difference fields of an assay substrate that have been treated in accordance with the present invention, repeated in different days after treatment, in particular a $TiO_2$ filled COP substrate treated with Ar/O2 plasma show after 114 days a contact angle below 65°. The untreated $TiO_2$ filled COP substrate have a contact angle of 110-120°.

Figure 25:
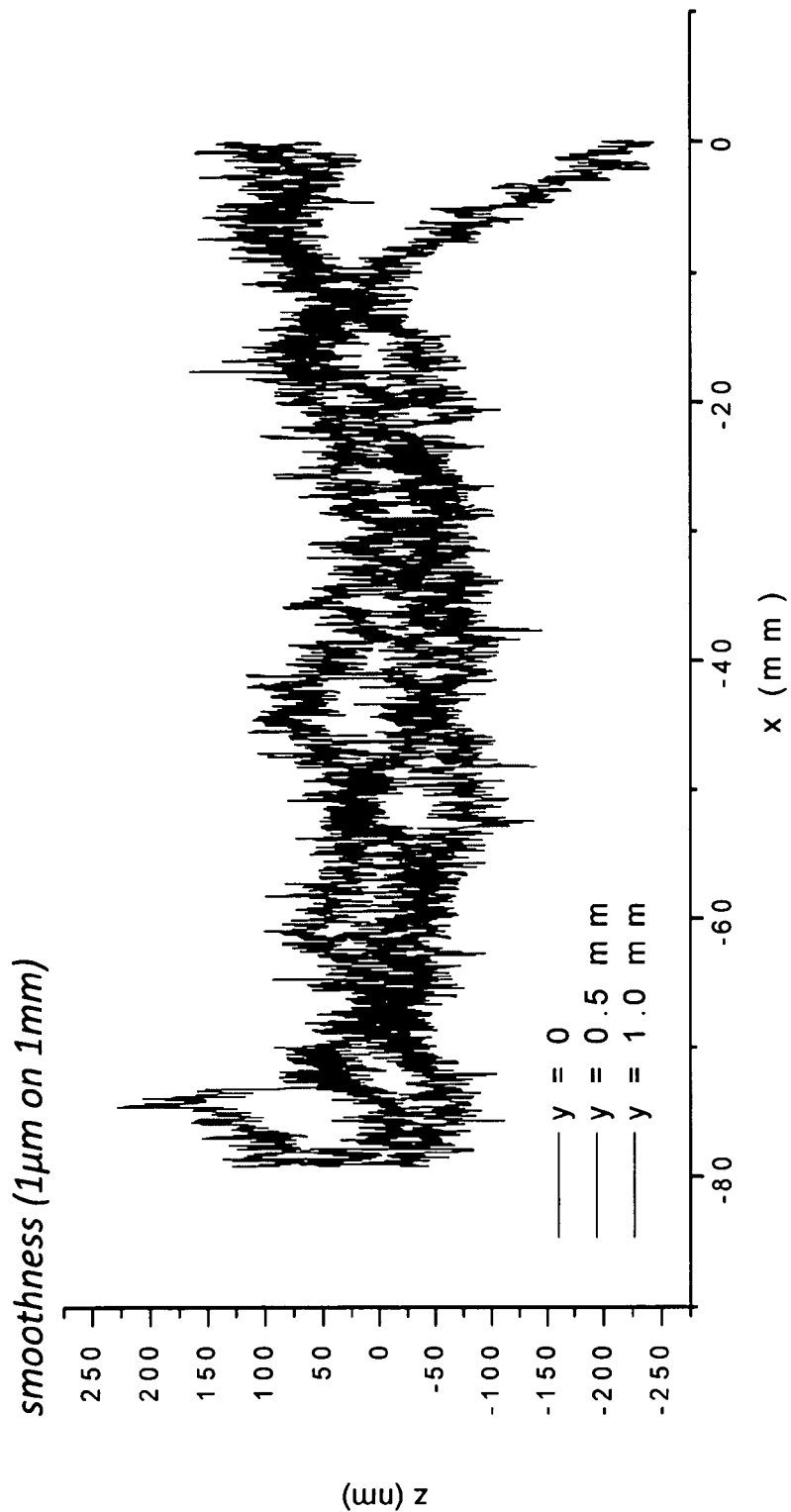
Figure 25:
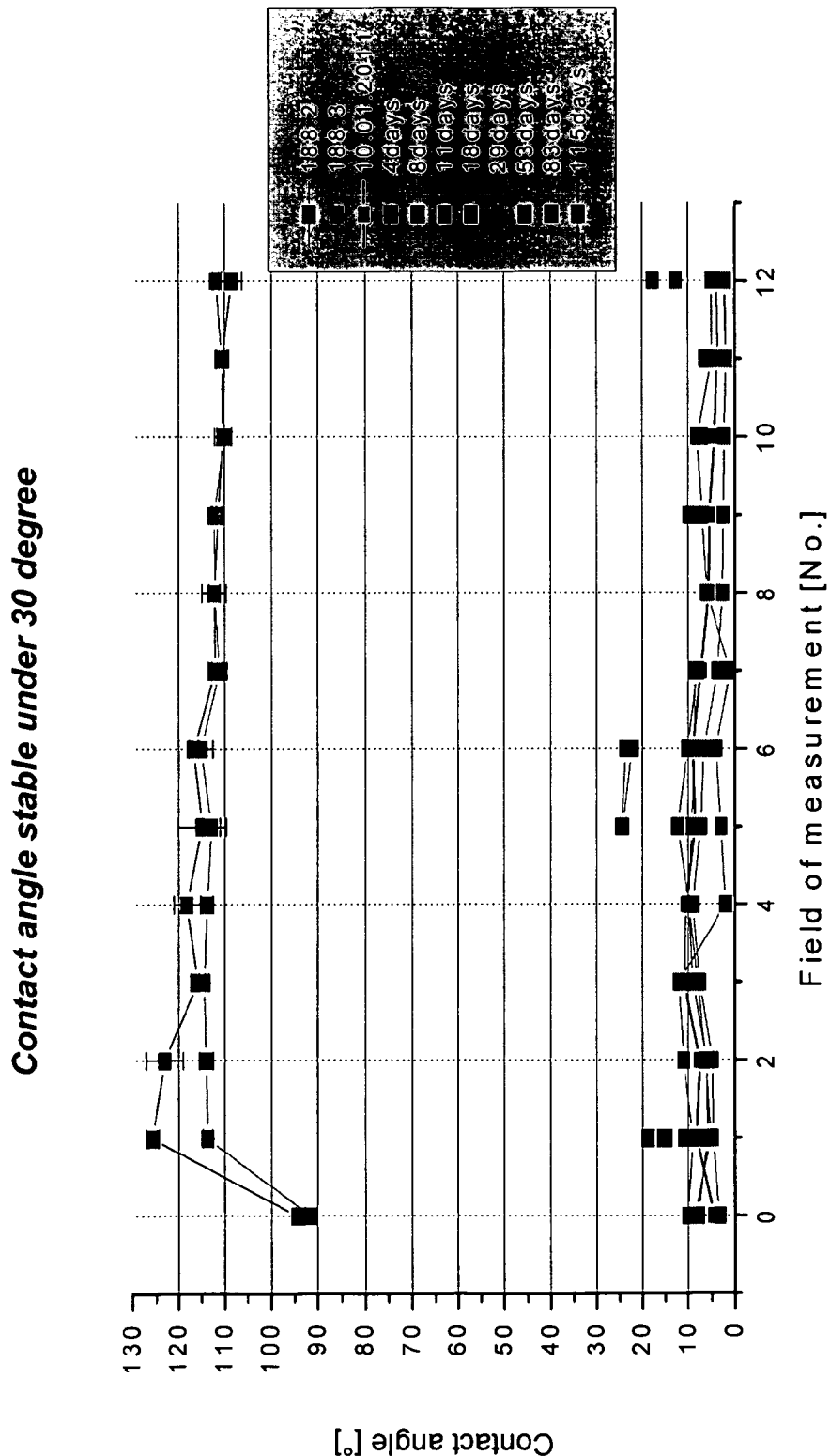

FIG. 25 shows (a) three 80 mm profilometer scan lines along the x-direction, offset in the y-direction by 5 mm, on a COP slide after treatment. The undulations in height are all below 1 μm on 1 mm range, and show (b) the contact angle measured in difference fields of an assay substrate that have been treated in accordance with the present invention, repeated in different days after treatment, in particular a COP substrate coated with SiO2 thin film show after 115 days a contact angle below 30°.

Figure 26:
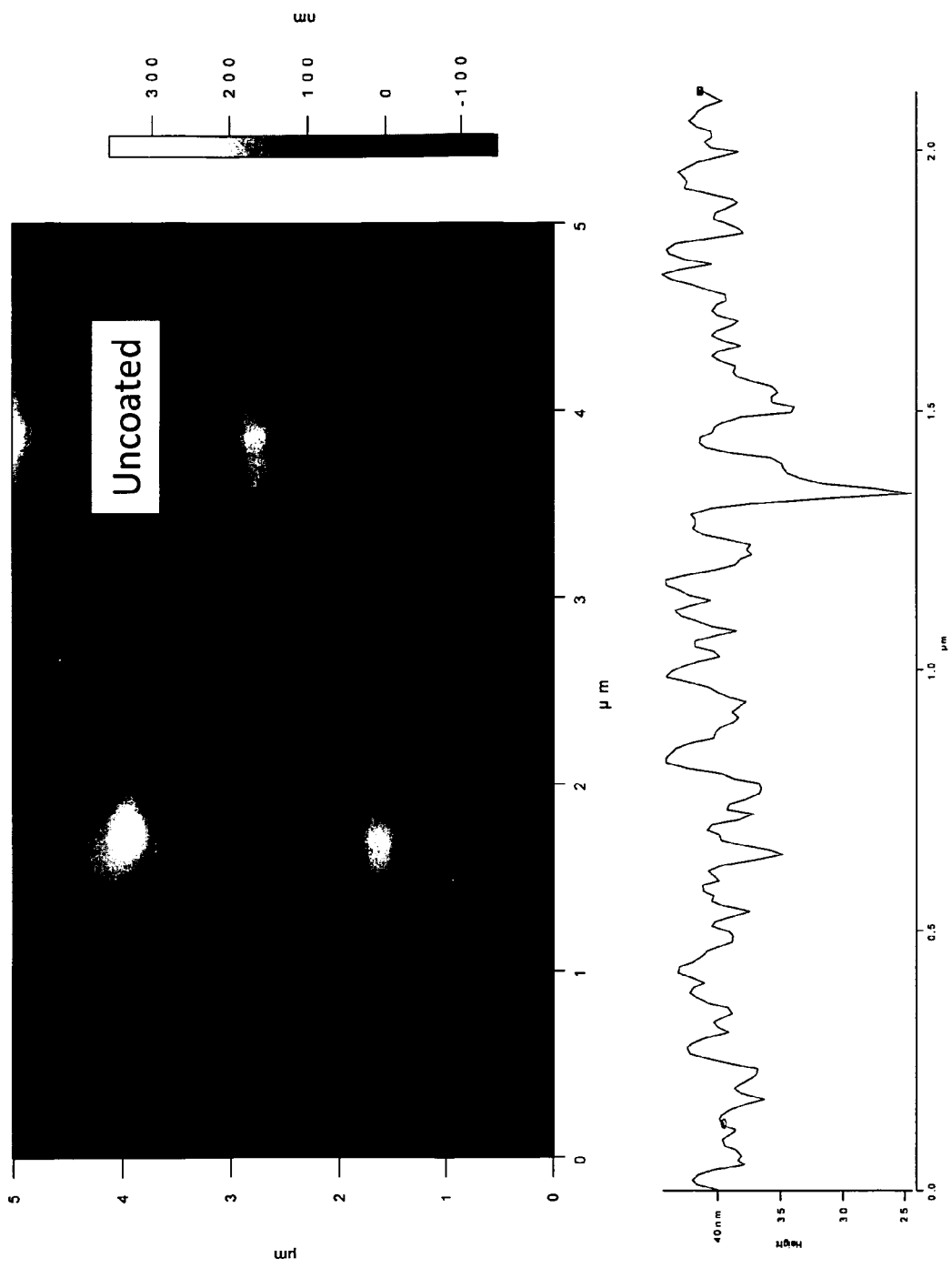
Figure 26:
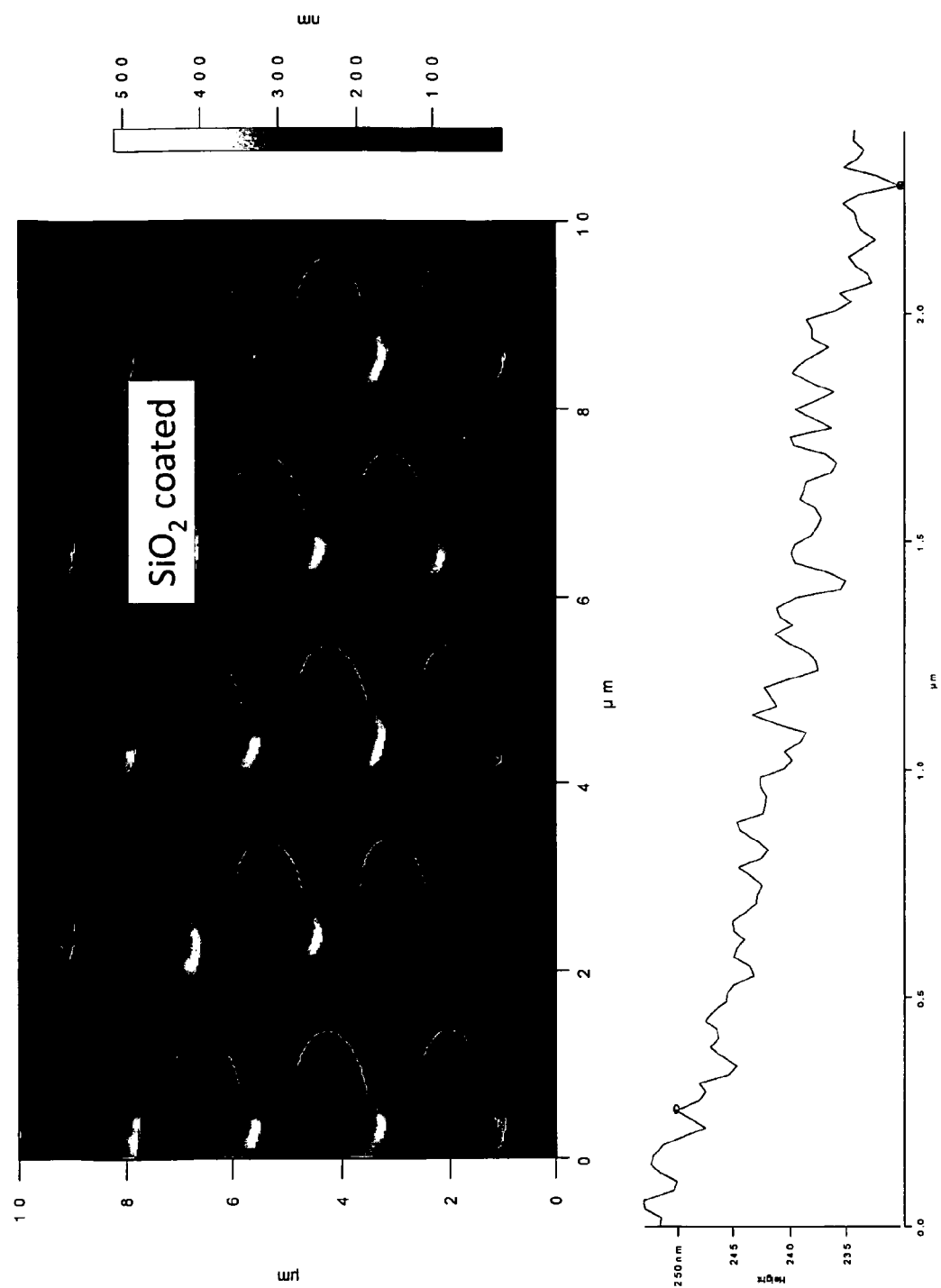
Figure 27:
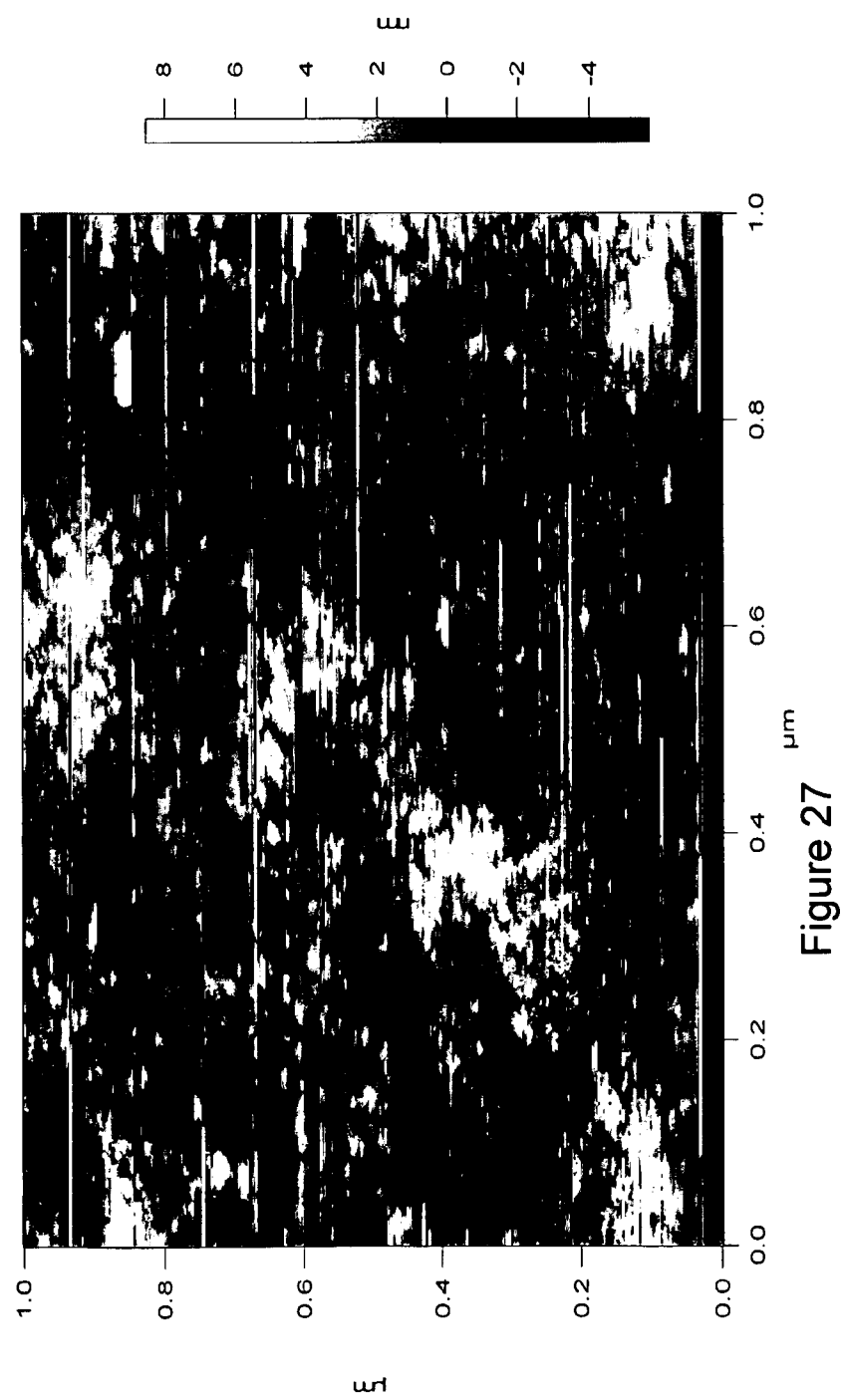

FIG. 26 shows AFM topography scans of (a) molded wells in a plastic substrate, and (b), the same plastic substrate after evaporation of 20 nm $SiO_2$. Morphology and roughness of the wells are not affected by the $SiO_2$ evaporation, FIG. 27 shows AFM topography scans of 1×1 μm$^2$ of a COC substrates after Ar/O2 plasma treatment, the roughness is increasing from 0.8 nm rms of the bare substrate to 6 nm rms after the treatment.

Figure 28:
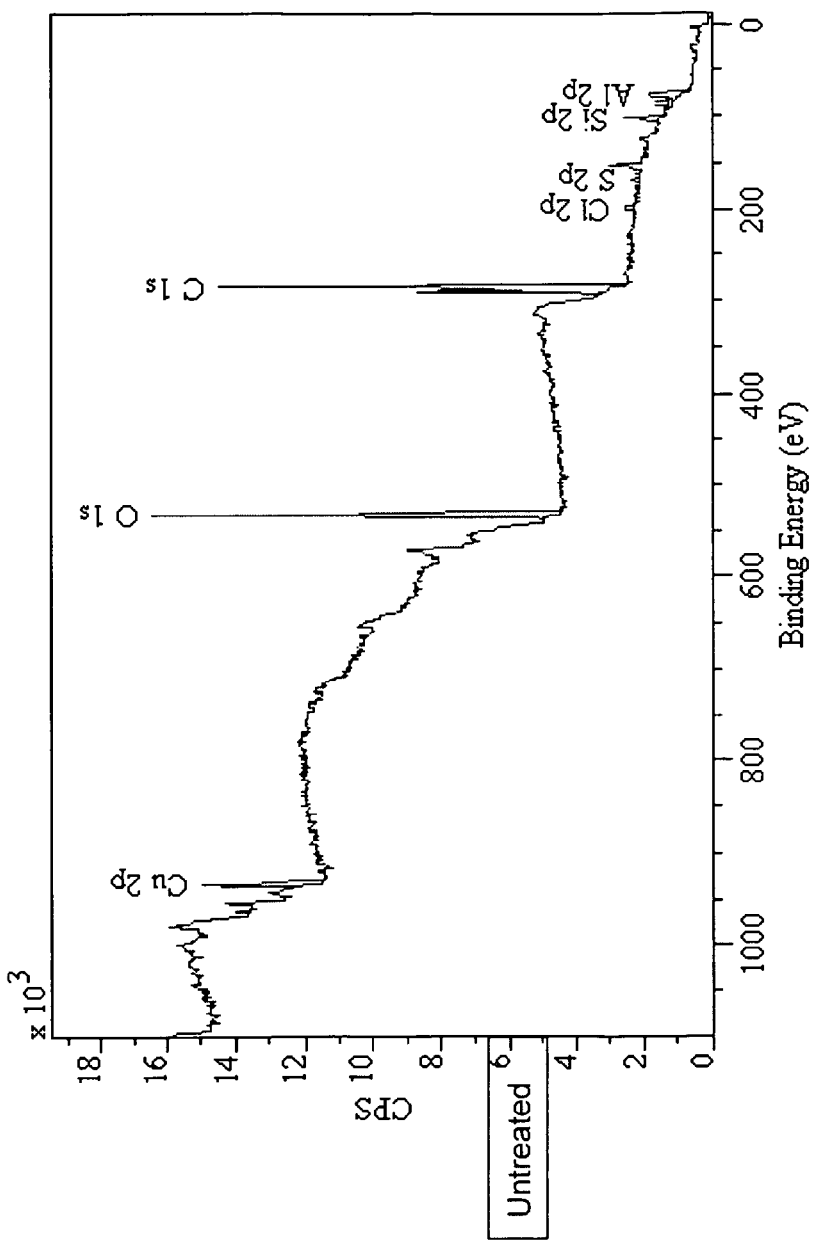
Figure 28:
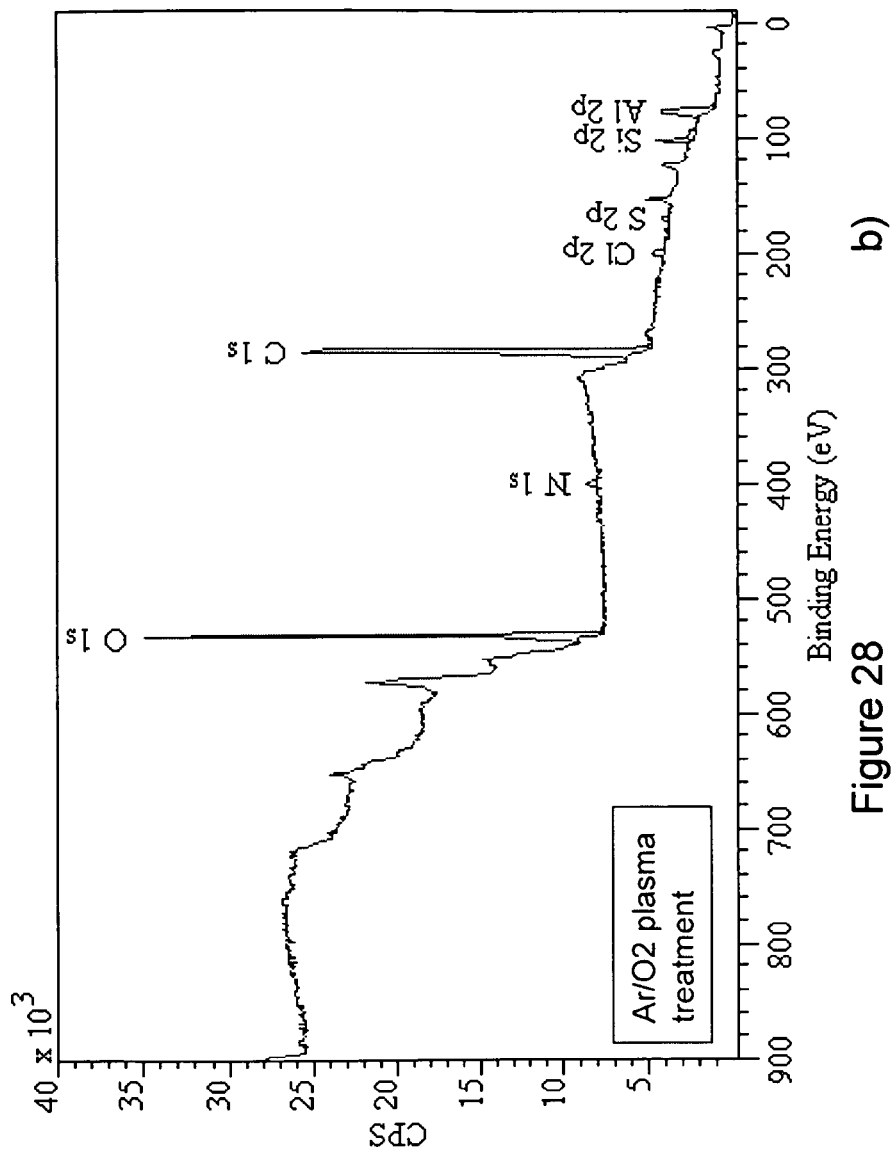
Figure 29:
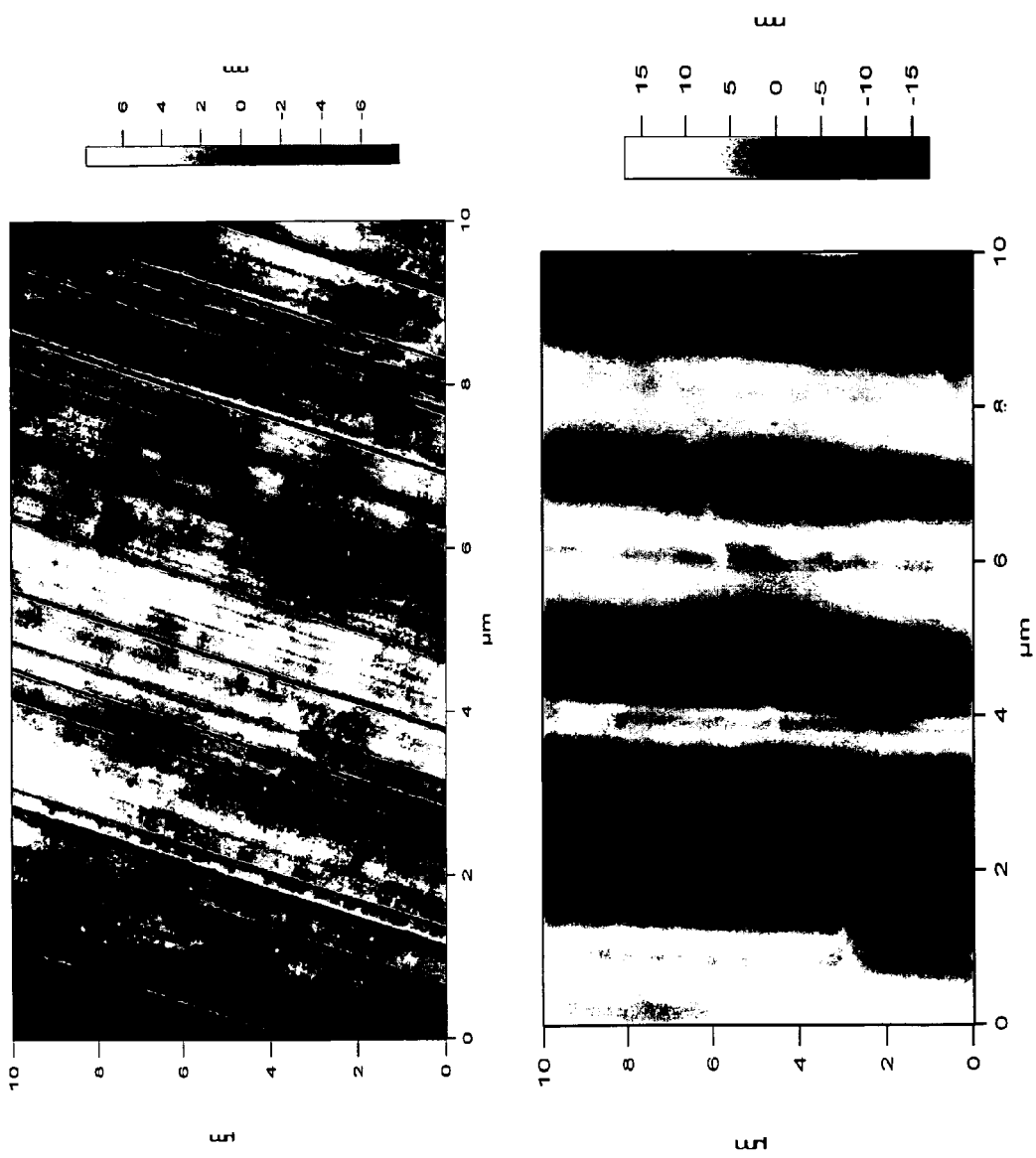

FIG. 28 shows an XPS spectrum of (a) an untreated and (b) an Ar/O2 plasma treated COC flow cytometry chip. The data confirm that the treatment did not change the chemical composition of the polymeric substrate, FIG. 29 shows AFM topography scans of (a) 10×10 μm$^2$, and (b), of 1 μm$^2$ area of COC substrates before and after TEOS coating.

Figure 30:
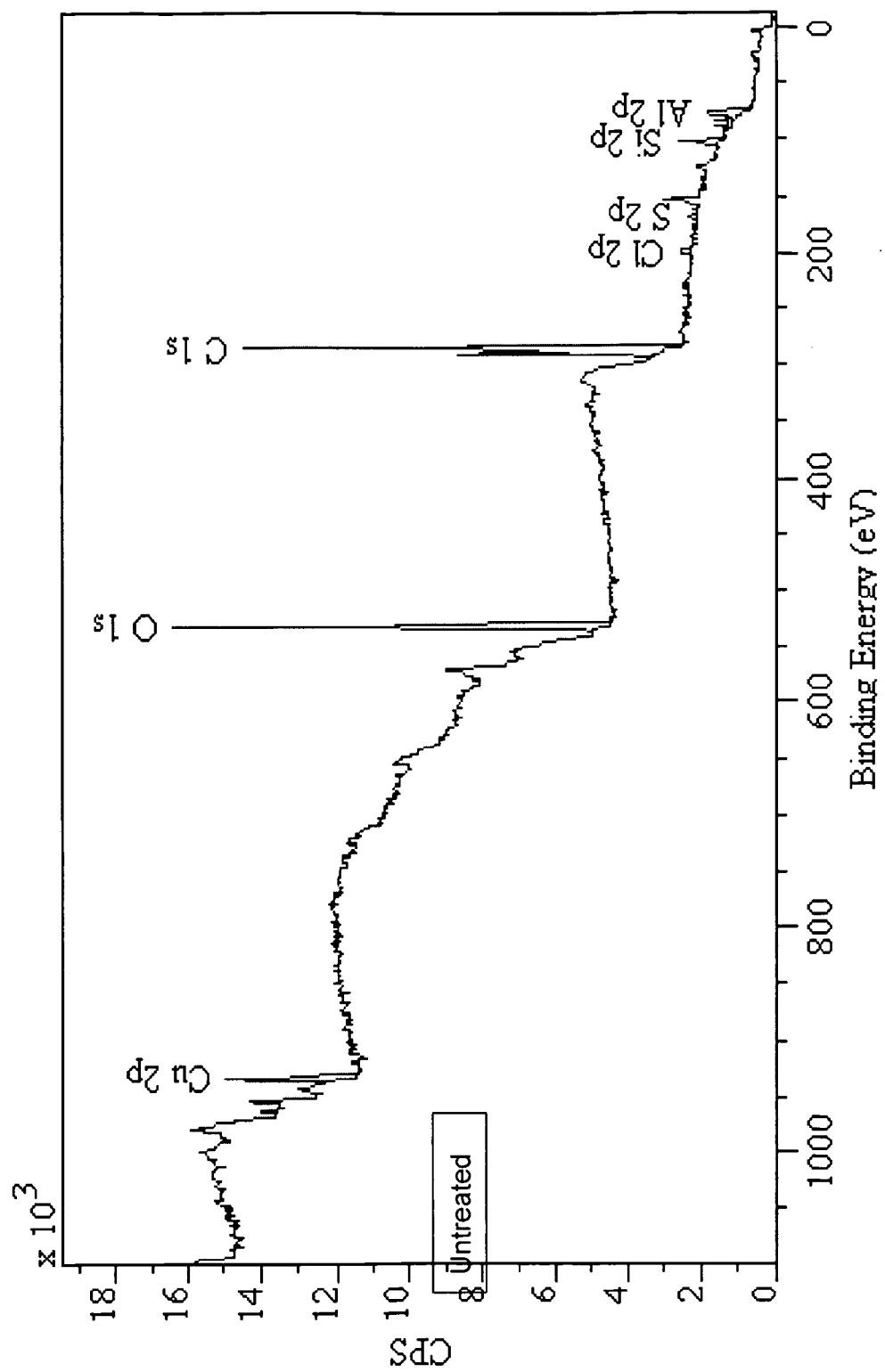
Figure 30:
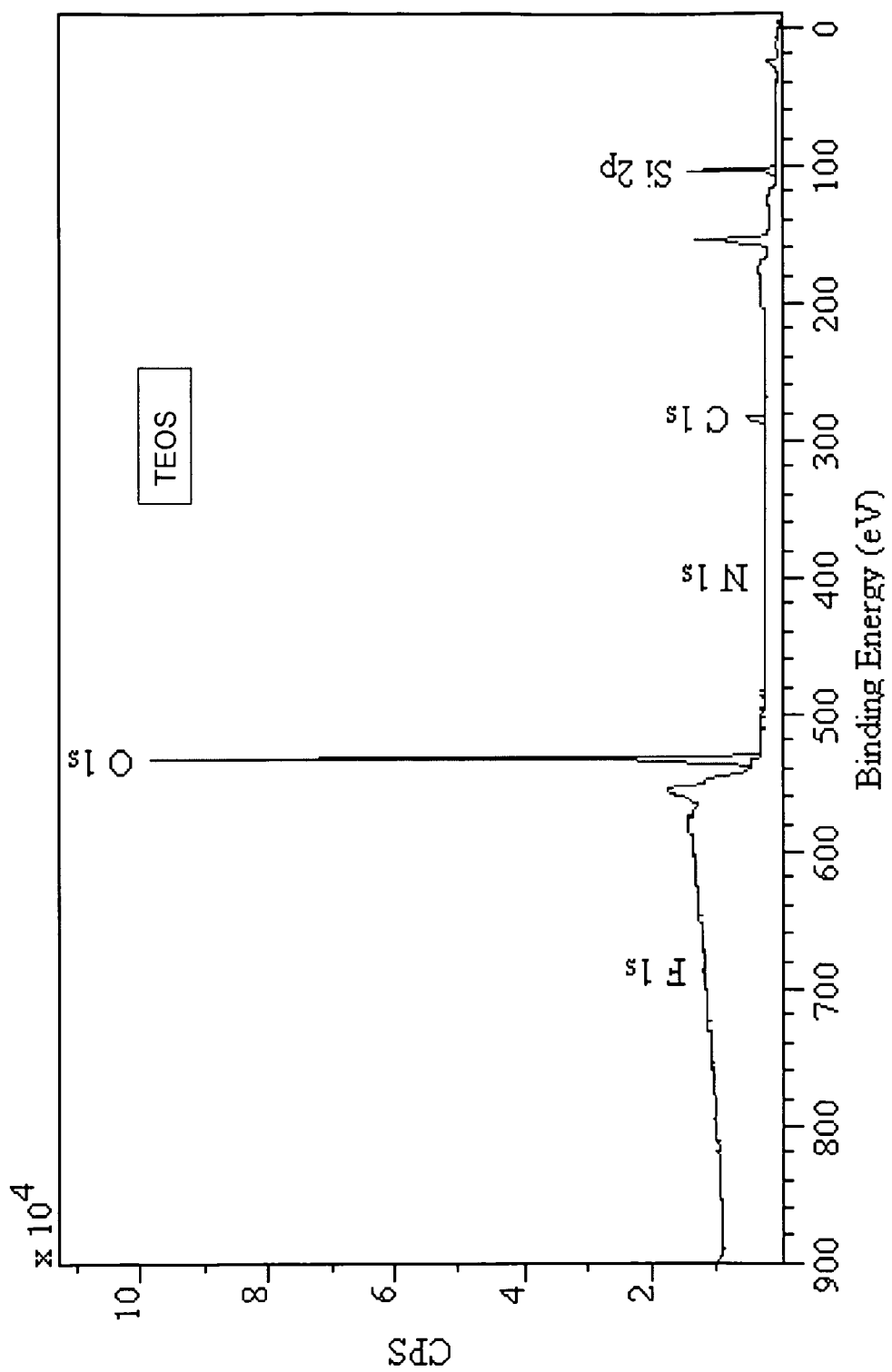
Figure 31:
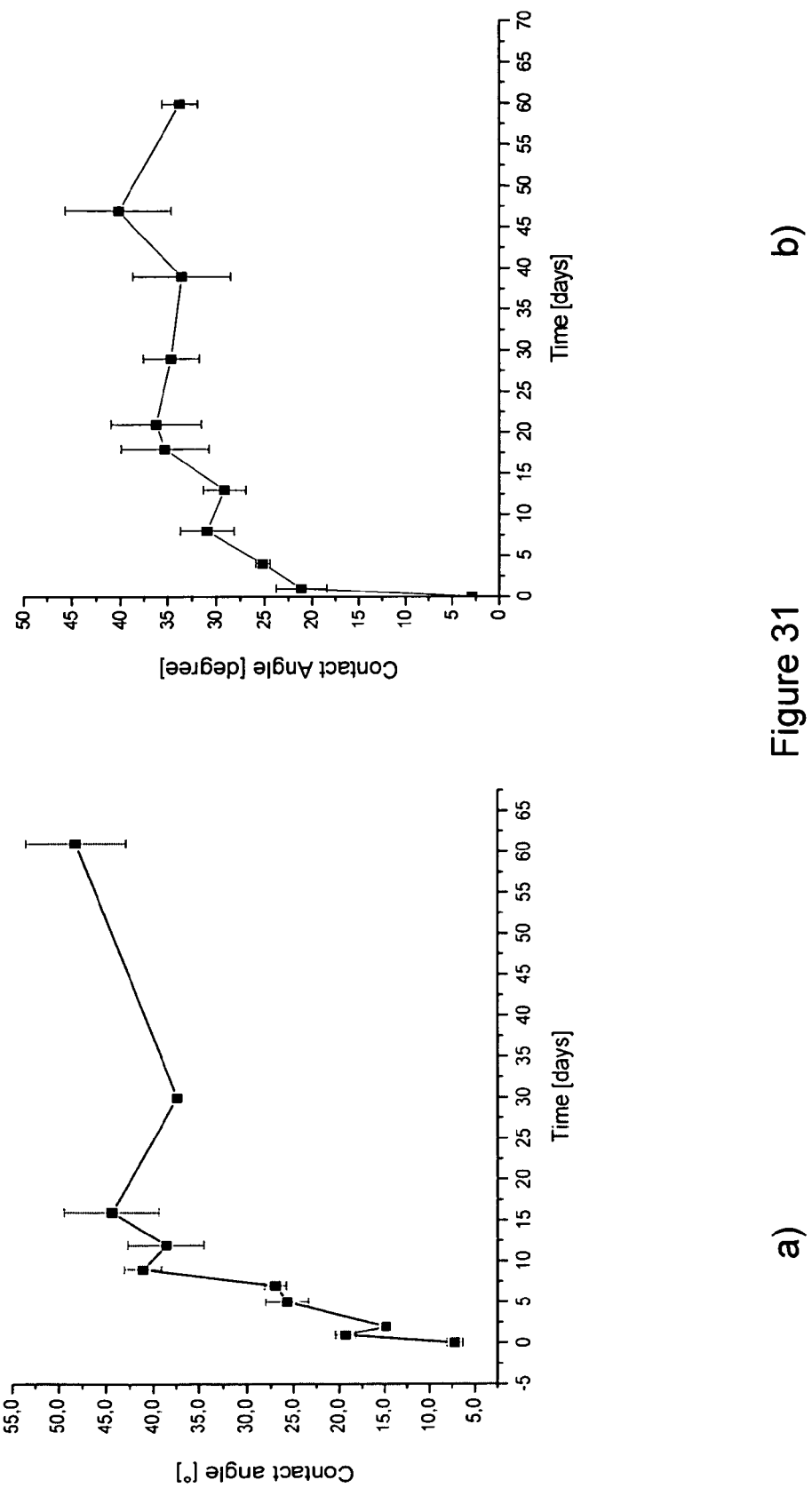

FIG. 30 shows an XPS spectrum of (a) an untreated and a (b) TEOS coated COC flow cytometry chip. The data confirm the presence of $SiO_2$ on the substrate surface of the chip coated with TEOS, FIG. 31 shows contact angle versus time measured on a COC flow cytometry chip which have been treated in accordance with the present invention, in particular (a) an Ar/O2 plasma treated chip and (b) a COC substrate coated with TEOS. In (a) the contact angle stay below 45° for 60 days and in (b) the contact angle stay below 40° for 65 days.

Figure 32:
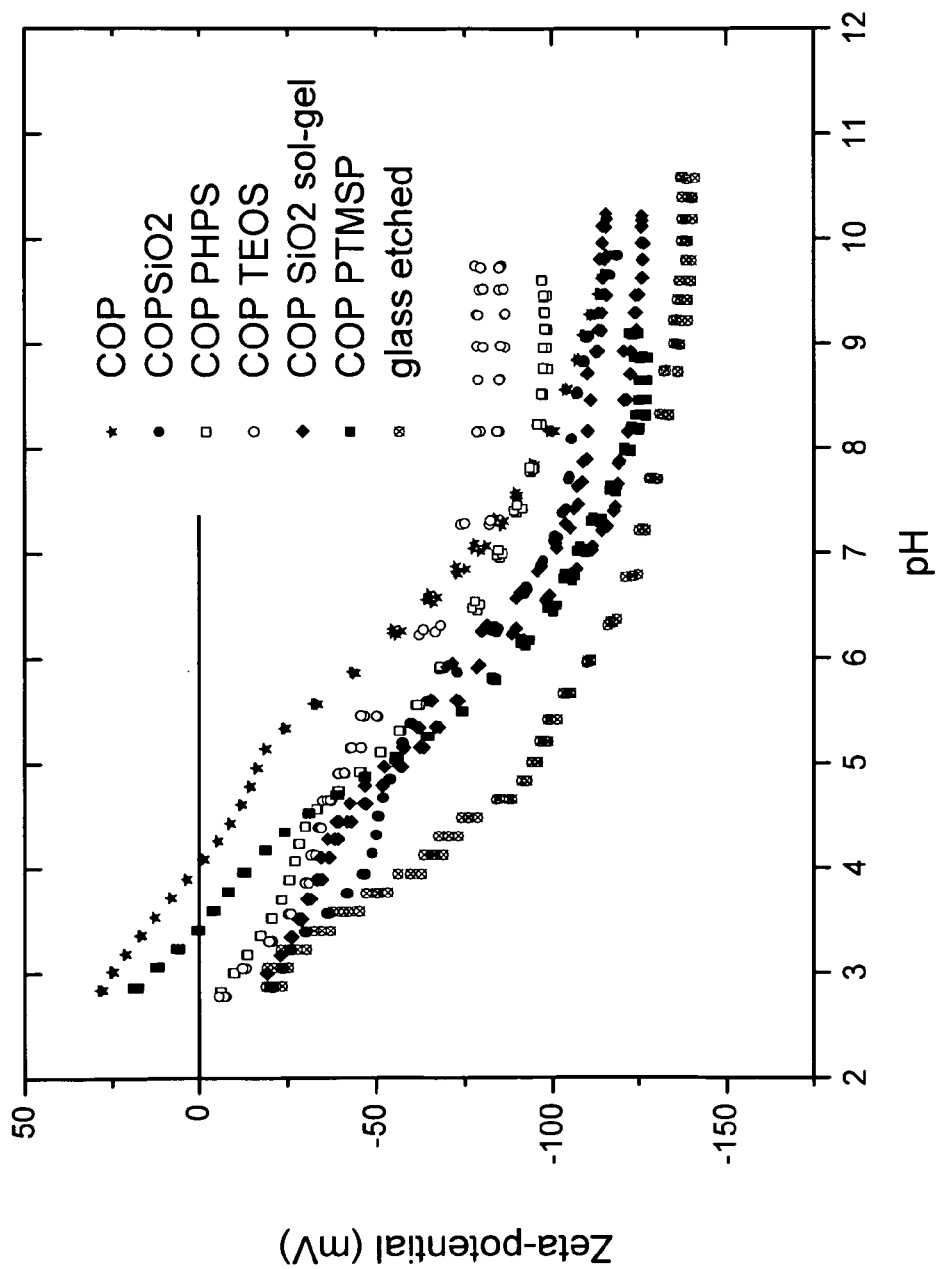
Figure 33:
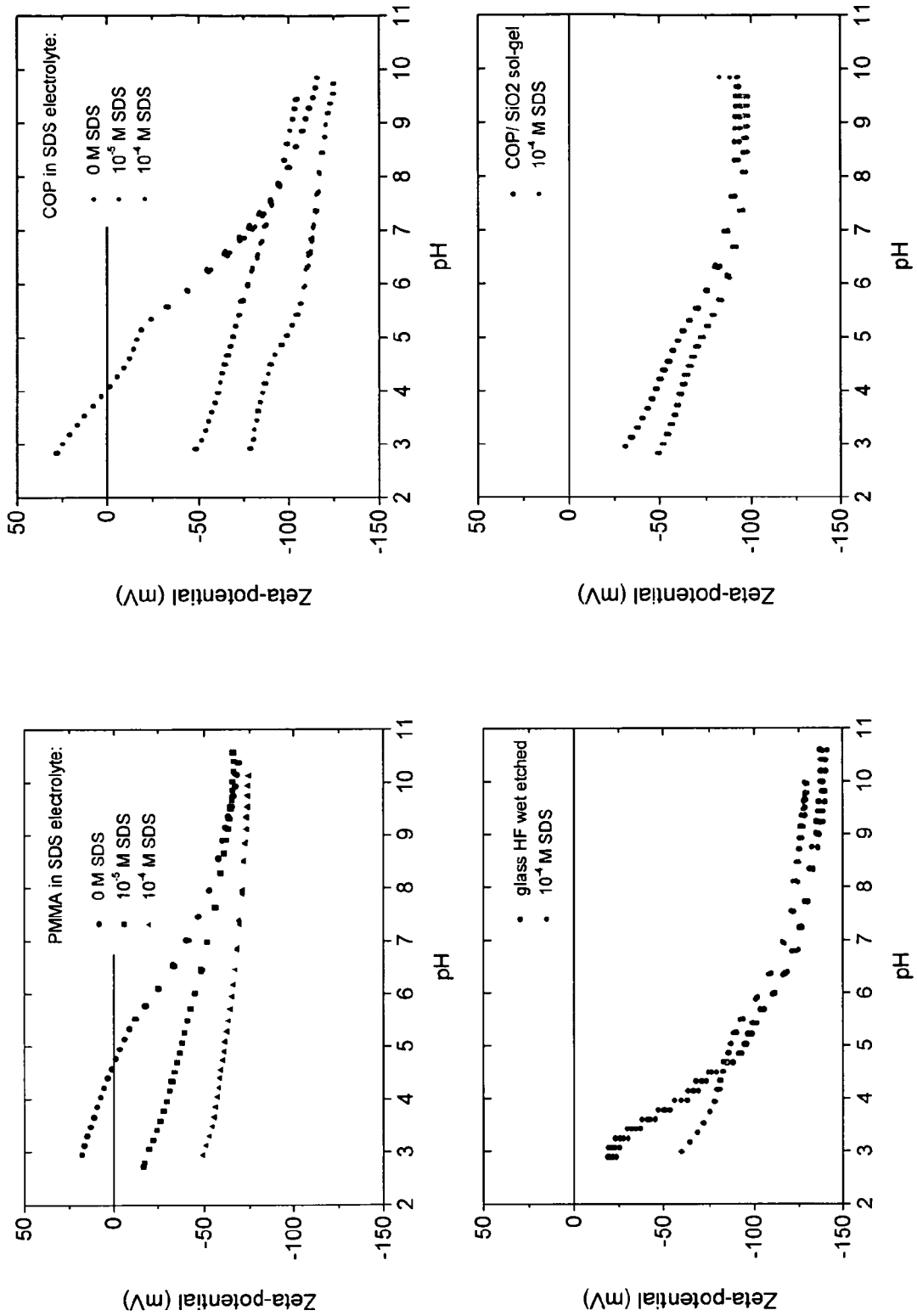
Figure 34:
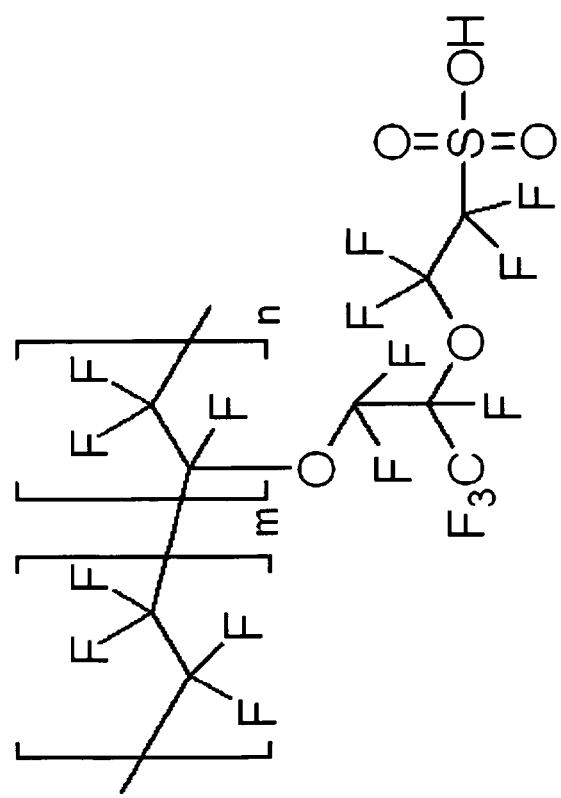
Figure 35:
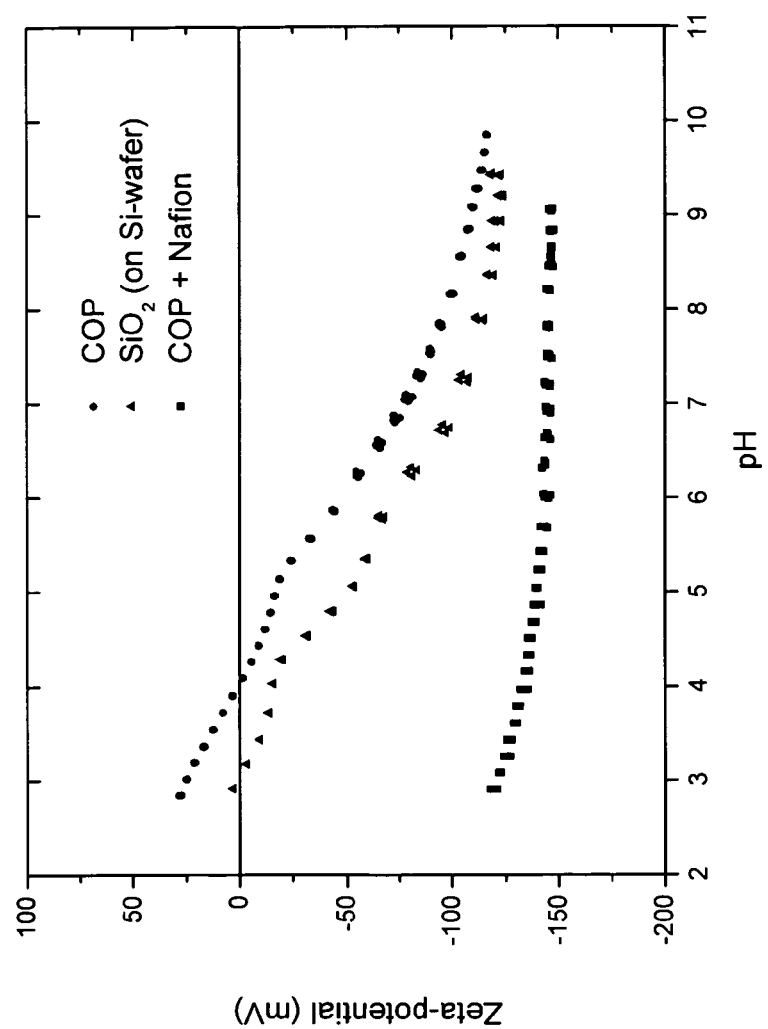

FIG. 32 shows a comparison of the Zeta potential as a function of pH for different glass surfaces to bare polymer surfaces and glass-like surfaces on polymer substrates. The IEP (isoelectric point), the pH below which the Zeta-potentials are negative, can be seen to be shifted below pH 3 for the glass-like surfaces, FIG. 33 shows a comparison of the Zeta potential as a function of pH for PMMA and COP surfaces to an etched glass surface and a SiO2 sol-gel covered surface, as well as the effect of SDS on the different surfaces. While SDS strongly affects the Zeta potentials on the bare PMMA and COP surfaces, the effect is much weaker for the SiO2 sol-gel covered substrate, similar to the behaviour observed for the etched glass surface, FIG. 34 shows the chemical structure for nafion, FIG. 35 shows a comparison of the Zeta potential as a function of pH for COP, COP covered by a layer of nafion, and of a Si-Wafer covered by a 400 nm layer of $SiO_2$.

Furthermore, reference is made to the following examples, which are given to illustrate, not to limit the present invention:

EXAMPLES

In the following examples, the order in which the steps are listed typically is the order in which these steps are performed for the experiment.

Example 1

Figures 1, 2:
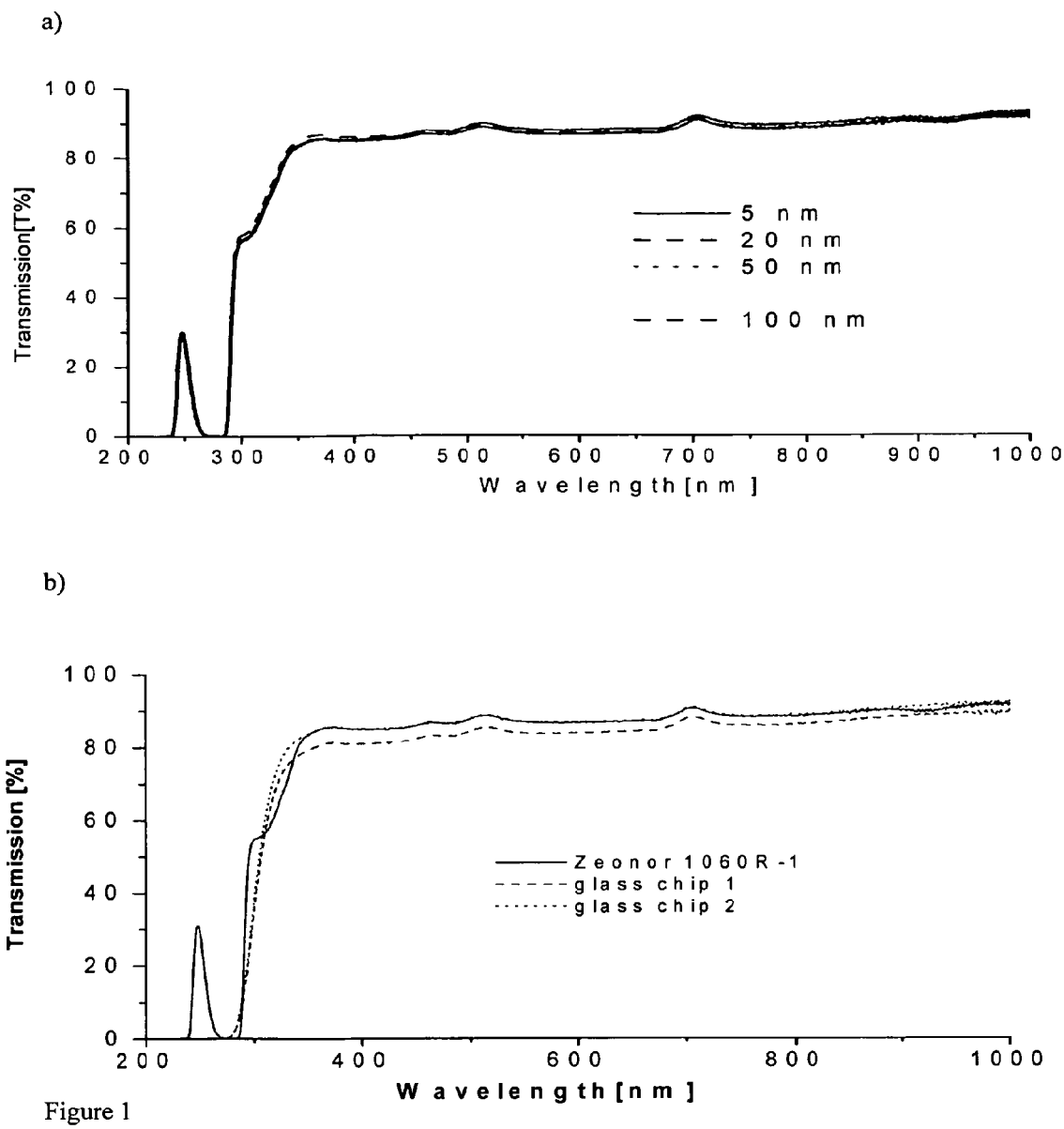
Figure 3:
FIG. 3 shows an example image of a substrate having appropriate channels therein, with channel dimensions before and after coating with $SiO_2$.

COC Substrate Coated by Evaporated SiO$_2$ Film (FIGS. 1-3)
Substrate: COP (Zeonor 1060R)
Coating: 20 nm SiO$_2$ by thermal evaporation
optical transparency is higher than 85% (see FIG. 1)
water contact angle (after 12 h): 5°, stabilizes at about 40° (see FIG. 2)
the channel dimensions of the substrate are hardly modified by the coating procedure which indicates that the channels are not totally filled or blocked with SiO$_2$ (see FIG. 3).

Example 2

Figure 4:
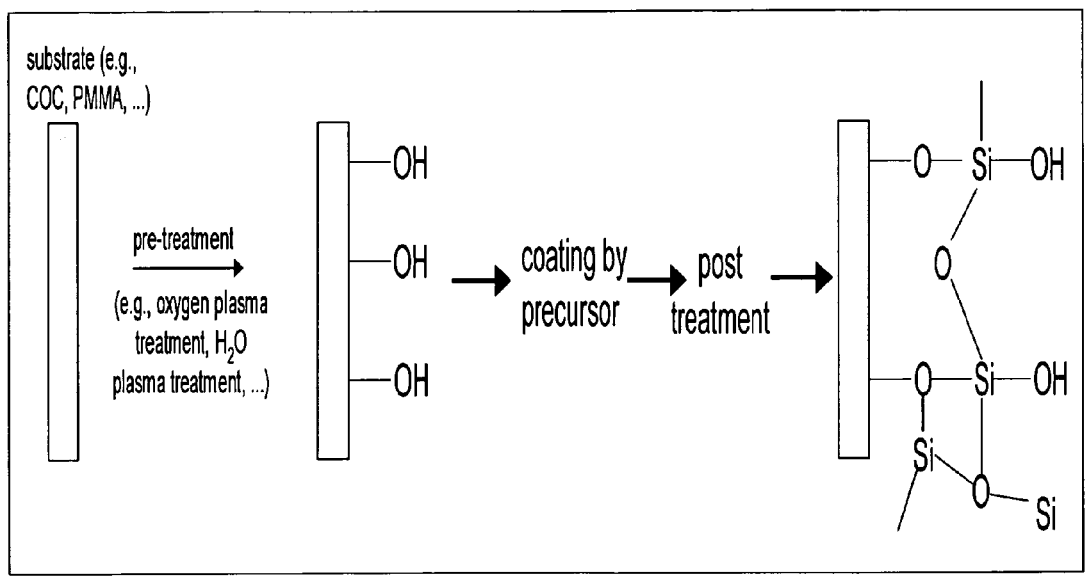
FIG. 4 shows a scheme for applying silane and siloxane as a liquid-$SiO_2$ precursor, preceded by plasma treatment, such as oxygen, or $H_2O$, or others.
Figure 5:
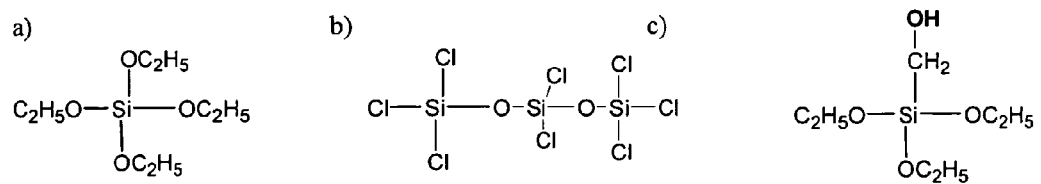
FIG. 5 shows examples of liquid $SiO_2$ precursors, a) Tetraethyl orthosilicate (TEOS) b) Octachlorotrisiloxane (OTCS), and c) Hydroxymethyltriethoxysilane (TTBS-OH)

PMMA Substrates Coated with TEOS Films (FIGS. 4-10)
A general scheme for SiO$_2$ precursor coating is shown in FIG. 4, structural formulas for some liquid precursors are given in FIG. 5.
substrate: PMMA channel plate and well plate (Diakon CMG 302)
Coating material: TEOS
Topography: 0.5 nm roughness (see FIG. 6)
Composition: XPS clearly shows Si picks at the substrate surface (FIG. 7)
Bonding at 70° C. The bonding scheme is shown in FIG. 8. Bonding was successful with no deformation of the channels and no leakage of fluids when filling the channels. (see FIG. 9 and FIG. 10).

Example 3

PMMA Substrates Coated with PHPS Films (FIGS. 11-13)
Substrate: PMMA channel plate and well plate (Diakon CMG 302)
Coating material: Perhydropolysilazane (PHPS) (see FIG. 11)
Post-treatment: NH$_4$OH vapour
Water contact angle: 15°
Topography: 1.7 nm roughness (see FIG. 12), channels dimensions are not modified (see FIG. 13) and channels are not filled up or blocked.
Bonding at 70° C. Bonding was successful.

Example 4

PMMA Substrate Coated with PTMSP Film (FIG. 14-15)
Substrate: PMMA channel plate and well plate (Delpet 70NH)
Coating material: Poly[1-(trimethylsilyl)-1-propyne] (PTMSP) PTMSP solution in Toluene
Coating Procedure: Spraying,
Characterisation: Contact angle: advancing: 107°, receding: 79°, the difference in the two angles indicates a rough and porous surface; FTIR: PTMSP signals are clearly identified (see FIG. 14); Profilometer: conduits dimensions are not modified, increased roughness is observed with AFM (FIG. 16); charging: PTMSP film can be charged (by biased-probe induced charging) with water ions just like glass (see FIGS. 15a and b).
Bonding at 70° C. Bonding was successful.

Example 5

PMMA Substrate Treated with Ar/O$_2$ Plasma (FIG. 16, 17)
Substrate: PMMA channel plate and well plate, (Delpet 70NH)
Treatment: Ar/O$_2$ Plasma
Characterisation: Contact angle: 50° (advancing), receding: <10°; AFM: 25 nm rms roughness (see FIG. 16);
Bonding at 70° C. Bonding was successful. An increased roughness and hydrophilicity mimicking that of glass was achieved.
Electrophoretic separation: successful DNA separation (see FIGS. 17a, and 17b separation on glass chip for comparison). A chip in accordance with the present invention provides the same electrophoretic separation of a DNA latter containing DNA molecules up to 7500 Dalton as achieved with glass chip. The gel used for the electrophoretic separation is based on polyacrilamide in 120 mM Tris-Tricine (pH 7.7-8). Dissolved detergents are SDS and LDS as well as fluorescent dye if staining occurs on chip.

Example 6

Wet Coating of COP Chip with SiO$_2$ Sol-Gel (FIG. 18)
Material: COP channel and well plate (Zeonor 1060R)
Treatment: the substrate is exposed to chloroform vapor for few minutes before bonding.
Bonding at 70° C. Bonding was successful.
Wet-coating: SiO$_2$ sol-gel
Electrophoretic separation: good protein separation (see FIGS. 18a, and 18b separation on glass chip for comparison). A chip in accordance with the present invention provides the same electrophoretic separation of Bovine Serum Albumin (a protein) in different concentrations (e.g. 500 µg/ml, 1000 µg/ml, 2000 µg/ml) as achieved with glass chip. Molecular weight marker containing 6 proteins (29 kDa, 45 kDa, 66 kDa, 97 kDa, 116 kDa, 200 kDa). The gel used for the electrophoretic separation is based on polyacrylamide in 120 mM Tris-Tricine (pH 7.7-8). Dissolved detergents are SDS and LDS as well as fluorescent dye if staining occurs on chip.

Example 7

COP Substrate Treated with Ar/O$_2$-Plasma

Substrate: COP channel and well plate (Zeonor 1060R)
Treatment: Ar/O$_2$ Plasma
Bonding at 85° C. and at constant pressure Bonding was successful. The obtained chip has no bonding voids and no channel deformation (FIG. 19).

Example 8a

COP Substrate Treated with Ar Plasma/UV-Ozone

Substrate: COP channel and well plate (Zeonor 1060R)
Treatment: Ar plasma/UV-Ozone cleaner
Bonding at 85° C. and at constant pressure Bonding was successful. (FIG. 20).
Bonding force: 300N for 20 s were applied. The samples did not detach.

Example 8b

PMMA Substrate Treated with Ar-Plasma/UV-Ozone

Substrate: PMMA channel and well plate (PMMA Delpet 70NH)
Treatment: Ar plasma/UV-Ozone
Bonding at 85° C. and at constant pressure Bonding was successful. FIG. 21 shows an (a) optical microscope image of a cross section of a COP bonded conduit formed by two substrates that have been treated with Ar plasma/UV-Ozone; there is no deformation of the structure that can be seen in the optical microscope image, the dimensions of the channel/conduit do not change upon treatment and bonding. FIG. 21(b) shows an electrophoretic separation of DNA 7500 analyte obtained with a COP chip treated with Ar plasma/UV-Ozone.

Example 9

COP-Substrate Treated with $SiO_2$ Sol-Gel

Substrate: COP channel and well plate (Zeonor 1060R)
Coating:
Coating material: SiO2 sol-gel
Coating Procedure: Spraying
Post treatment: O2-plasma
Bonding at 87° C. Bonding was successful, the obtained chip has no bonding voids and no channel deformation.

Example 10

PMMA-Substrate Treated with SiO2 Sol-Gel

Substrate: PMMA channel and well plate (PMMA Delpet 70NH)
Coating:
Coating material: SiO2 sol-gel
Coating Procedure: Spraying
Post treatment: O2-plasma
Bonding at 85° C. was successful. The obtained chip has no bonding voids and no channel deformation.

Example 11

Application of Substrates According to the Present Invention for Assay Applications, such as Genome Sequencing Transferring assay chemistries which have been developed for glass substrate often requires the addition of detergents to ensure the wetting of the hydrophobic plastic surface or to avoid the sticking of proteins or other biomolecules on these hydrophobic surfaces. Adding such detergents may negatively impact the performance of the assay, since such substances can lead to denaturation of proteins or other biomolecules. Large protein molecules can easily loose their functionality in the presence of detergents or other surface active substances. Providing surfaces with glass like properties ensures easy transfer of such assays to plastic consumables. It should also be mentioned that Cells or cell fragments are most easily damaged or destroyed by exposure to detergents or hydrophobic plastic surfaces. Any of the above examples represent cases, where the protein or biomolecule, large protein assemblies or cells and cell fragments are exposed to none native conditions in which they may behave very differently from within their natural environment. A glass like coating in accordance with the present invention with the right pH and ion concentration in the buffer can minimize such negative influence The substrates in accordance with the present invention can also be used to be applied in a genome sequencing assay. Conventionally, such genome sequencing is performed in a silicon chip having 50 million wells of a defined diameter and depth, wherein each well is filled with a polystyrene bead decorated with DNA. Consequently, if such structure is to be manufactured using the substrates in accordance with the present invention, the same requirements apply for the substrate in accordance with the present invention: The wells must be arranged at a defined distance from each other (FIG. 23); the substrate must have a defined smoothness, hydrophilicity and low cost. Typically, in one example, the smoothness of the substrate is 1 µm on 1 mm, and the contact angle is between 20 and 50°.

The following treatment was performed:
COP Treated with $Ar/O_2$ Plasma
Substrate: COP (Zeonor 1060R) with and without TiO2 filling material
Treatment: $Ar/O_2$-plasma
FIG. 24 shows contact angle measured in difference fields of an assay substrate that have been treated in accordance with the present invention, repeated in different days after treatment. In particular a $TiO_2$ filled COP substrate treated with $Ar/O_2$ plasma shows a contact angle below 65° after 114 days. The untreated $TiO_2$ filled COP substrate has a contact angle of 110-120°.
COP Treated with SiO2
Substrates: COP (Zeonor 1060R) with and without TiO2 filling material,
Coating: 20 nm $SiO_2$ by thermal evaporation and sputtering Profilometer measurements are shown in FIG. 25 which makes it clear that the differences in height are rather small and are within a range of approximately 300 nm. At the same time, the contact angle remains stable in various positions over a considerable amount of time, i.e. up to 115 days, at least.

FIG. 26 shows AFM topography scans of (a) molded wells in a plastic substrate, and (b), the same plastic substrate after evaporation of 20 nm SiO2. Morphology and roughness of the wells are not affected by the SiO2 evaporation

Example 12

Application of Substrates According to the Present Invention for Flow Cytometry The substrates according to the present invention can also be used for flow cytometry applications. In this respect, they need to fulfil the following requirements: there must be no cell adhesion, there must be a hydrophilicity with a contact angle between 20-50 degrees, and there must be pressure durability. Furthermore, there must not be the possibility of air bubble formation during the loading of the chip.

Substrate Treatment with Ar/O2 Plasma
:Substrates: COC half-channel plates (Topas 8007 X10)
Treatment: Ar/O2 plasma
Bonding at 75° C. at constant pressure was successful.

FIG. 27 shows AFM images of the surface treated in accordance with this example according to the present invention. The roughness was increased after the Ar/O2 treatment from 0.8 rms to 6 rms, showing that the same treatment can be apply on different polymeric material obtaining the same surface morphology.

FIG. 28 shows an XPS spectrum of (a) an untreated and a Ar/O2 plasma treated (b) COC flow cytometry chip sample to confirm that the treatment did not change the chemical composition of the polymeric substrate.

Substrate Treatment with TEOS
Substrates: COC half-channel plates (Topas 8007 X10)
Coating material: TEOS
Coating Procedure: Dipping
Post-treatment: O2 Plasma
Bonding at 76° C. at constant pressure was successful.

FIG. 29 shows substrate surfaces before and after the treatment according to the present invention, and FIG. 30 shows the corresponding XPS measurements.

It can be seen that the surface morphology did not change (same rms on a 1×1 μm$^2$) while the XPS confirmed the presence of SiO2 on the surface of the treated sample.

The long-time stability of the treatments according to the present invention have also been measured as can be seen in FIGS. 30a and b which basically show that the contact angle of the COC plates (Topas 8007 X10) stays below 50° for extended periods of time, thus proving that the methods in accordance with the present invention will produce substrates that can be used for commercial purposes and are also amenable to multi-use-applications.

Example 13

The substrates in accordance with the present invention can also be characterized to have glass-like behaviour by measuring the respective zeta potential. As can be seen in FIG. 32, the glass-like substrates in accordance with the present invention have zeta potential curves that have the same shape and values as a glass surface. More specifically, the IEP (isoelectric point), the pH below which the Zeta-potentials are negative, can be seen to be shifted below pH 3 for the glass-like surfaces.

Furthermore, as can be seen in FIG. 33, the surfaces/substrates in accordance with the present invention have the same behaviour as glass, when in contact with SDS. More specifically, the zeta potential is not much affected by the presents of SDS, whereas for substrates not treated in accordance with the present invention, the influence of SDS is much bigger. More specifically FIG. 33 shows a comparison of the Zeta potential as a function of pH for PMMA and COP surfaces to an etched glass surface and a SiO2 sol-gel covered surface, as well as the effect of SDS on the different surfaces. While SDS strongly affects the Zeta potentials on the bare PMMA and COC surfaces, the effect is much weaker for the SiO2 sol-gel covered substrate, similar to the behaviour observed for the etched glass surface.

Example 14

One possibility for a surface treatment in accordance with the present invention is to treat the polymeric substrate with nafion which is a sulfonated tetrafluoroethylene based fluoropolymer-copolymer. It is a ionomer which forms ion-exchange membranes. It has a highly specific conductance for protons in solution and allows a proton conduction due to the formation of water channels. The structure of nafion and the mechanistic details of its behaviour can be inspected in FIG. 34 which show the chemical structure of nafion as well as a scheme to explain the behaviour of nafion in and towards water.

FIG. 35 shows the zeta potential of a substrate in accordance with the present invention that has been coated with nafion. The nafion coated substrate shows a very negative zeta potential which is even more negative than glass.

This makes substrates in accordance with the present invention that have been treated with nafion obtaining a glass-like surface.

The features of the present invention disclosed in the specification, the claims and/or in the drawings may, both separately and in any combination thereof, be material for realizing the invention in various forms thereof.

The invention claimed is:

1. A microfluidic chip comprising
    a polymeric substrate that has been modified to have a first etched-glass-like surface having a roughness of >3 nm and
    a second substrate that is bonded to the first etched-glass-like surface, wherein at least one of the first or second substrates has at least one channel, groove, recess or hole that forms a conduit at an interface between said substrates;
    wherein said modified surface consists essentially of a single surface layer of a SiO$_x$ film, wherein x is from 1 to <2, or
    wherein said modified surface consists essentially of a surface layer of a sulfonated teterafluoroethylene based fluoropolymer-copolymer ("nafion") or poly[1-(trimethylsilyl)-1-[propyne] ("PTMSP").

2. The microfluidic chip of claim 1, wherein said modified surface consists essentially of a single surface layer of a SiO$_x$ film, wherein x is from 1 to <2.

3. The microfluidic chip of claim 1 that comprises a surface modification consisting essentially of a single surface layer of a SiO$_x$ film, wherein x is from 1 to <2; wherein said single surface layer was formed by a process comprising coating a surface of the polymeric substrate with an SiO$_x$ precursor and converting said SiO$_x$ precursor into SiO$_x$.

4. The microfluidic chip of claim 1, wherein said surface modification consists of a single surface layer of a SiO$_x$ film, wherein x is from 1 to <2.

5. The microfluidic chip of claim 1, wherein said modified surface consists essentially of a single surface layer of a SiO$_x$ film, wherein x is from 1 to <2 that has been further treated with a surface layer of a sulfonated teterafluoroethylene based fluoropolymer-copolymer ("nafion") or poly[1-(trimethylsilyl)-1-[propyne] ("PTMSP") and/or further treated by exposing the surface of the polymeric substrate to at least one of a plasma treatment, reactive ion etching, or UV-ozone treatment.

6. The microfluidic chip of claim 1, wherein said modified surface consists essentially of a surface layer of a sulfonated teterafluoroethylene based fluoropolymer-copolymer ("nafion") or poly[1-(trimethylsilyl)-1-[propyne] ("PTMSP").

7. The microfluidic chip of claim 1, further comprising treating the polymeric substrate with at least one of a plasma treatment, reactive ion etching, or UV-ozone treatment.

8. The microfluidic chip according to claim 1, wherein at least one of the first or second polymeric substrates is selected from the group consisting of a polyolefin, a polyether, a polyester, a polyamide, a polyimide, a polyvinylchloride, a polyacrylate, and mixtures thereof.

9. The microfluidic chip according to claim 1, wherein at least one of the first or second polymeric substrates is selected from the group consisting of an acrylnitrile-butadien-styrene, a cyclo-olefin-polymer, a cycloolefin copolymer, a polymethylene-methacrylate, a polycarbonate, a polystyrole, a polypropylene, a polyvinylchloride, a polyamide, a polyethylene, a polyethylene-terephthalate, a polytetrafluoro-ethylene, a polyoxymethylene, a thermoplastic elastomer, a thermoplastic polyurethane, a polyimide, a polyether-ether-ketone, a polylactic acid, a polymethylpentene, and mixtures thereof.

10. The microfluidic chip according to claim 1, wherein at least one of the first or second polymeric substrates comprises an inorganic material.

11. The microfluidic chip according to claim 1, wherein at least one of the first or second polymeric substrates comprises an inorganic material selected from the group consisting of a carbon black, a metal oxide and a semiconductor.

12. The microfluidic chip according to claim 1, wherein at least one of the first or second the polymeric substrates contains a metal oxide selected from the group consisting of $SiO_2$, $Al_2O_3$, $TiO_2$, $ZrO_2$, and $Fe_2O_3$ or semiconductor selected from the group consisting of ZnS, SdS and SdSe.

13. The microfluidic chip of claim 1, wherein the second substrate is a solid substrate.

14. The microfluidic chip of claim 1, wherein the second substrate is a flexible foil.

15. The microfluidic chip of claim 1, wherein the second substrate is a polymeric substrate, a plastic film or a glass substrate.

16. The microfluidic chip of claim 1, wherein the conduit at the interface between said substrates extends from one edge of the substrate to another edge of the substrate or from one hole to another hole of a substrate allowing flow-through of liquid through said conduit.

17. The microfluidic chip according to claim 1, wherein the conduit has a dimension of <500 μm.

18. The microfluidic chip according to claim 1, wherein the conduit has a dimension of <200 μm.

19. The microfluidic chip according to claim 1, wherein the conduit is filled with a matrix suitable for at least one of the analysis, detection, separation and transport of analytes.

20. The microfluidic chip of claim 1, wherein said polymeric substrate has not been treated with detergent, exposed to chemicals other than those forming a single surface layer of an $SiO_x$ film, or activated by endowing it with functional chemical groups.

21. The microfluidic chip of claim 1, wherein said polymeric substrate has not been treated with a polyelectrolyte.

22. The microfluidic chip according to claim 1, wherein the hydrophilicity of the etched-glass-like surface is characterized by a water contact angle of less than 50°.

23. The microfluidic chip of claim 1, wherein said at least one surface has at least one property selected from the group consisting of a surface charge defined by a zeta potential <0 V for pH >2, a porosity characterized by pores ranging from 0.5 nm to 50 nm, and an inner surface of >100 $m^2g^{-1}$.

24. The microfluidic chip of claim 1, wherein the modified etched-glass-like surface on the first substrate has a roughness of >3 nm and mimics the surface of glass in at least one property selected from the group consisting of chemical content, chemical composition, chemical structure, homogeneity, morphology, porosity, hydrophilicity, surface energy affinity, adsorption affinity, surface functionality, chemical surface reactivity, physical surface reactivity, zeta potential and surface charge.

25. A method for making the microfluidic chip of claim 1, comprising:
   a) coating a surface of a first polymeric substrate with an $SiO_x$-precursor, converting the $SiO_x$-precursor to $SiO_x$ to form a first coated substrate having a single surface layer of $SiO_x$, wherein x ranges from 1 to <2, thus modifying the surface of the first coated substrate to form a substrate having an etched-glass-like surface; and/or
   b) coating a surface of the first polymeric substrate with a polymer thin film having at least one property selected from the group consisting of increased intrinsic roughness, increased intrinsic porosity and increased hydrophilicity to form a first coated substrate, and/or
   c) exposing the surface of the polymeric substrate to at least one of a plasma treatment, reactive ion etching, or UV-ozone treatment;
   contacting the first coated substrate having an etched-glass-like surface with a second substrate to form a microfluidic chip having a channel between the first and second substrates, wherein the channel has a flow dimension of <500 μm, and
   wherein the etched-glass-like surface has a roughness of >3 nm.

26. The method of claim 25, comprising a), wherein the $SiO_x$ precursor is selected from the group consisting of:
   i) alkoxy- or alkyl-chlorosilane, $SiX_4$, trisiloxane compound $Si_3O_2X_6$, X being, independently, at each occurrence OR or halogen, R being $C_1$-$C_{20}$ alkyl;
   ii) polysilazane —[Si(H)$_2$—N(H)—]$_n$, n being selected from 3 to 10,000;
   iii) polyorganosilazane —[Si(R)$_2$—N(R)—]$_n$, R being alkyl, n being selected from 3 to 100,000; and
   iv) a sol-gel containing $SiO_x$ particles having a diameter of from 1 to 10 μm suspended in a solvent-based matrix wherein the solvent is an alcohol.

27. The method of claim 25, comprising b), wherein the film is deposited by a physical deposition method selected from the group consisting of thermal deposition, electron beam deposition, sputtering, chemical vapour deposition, electroless plating, electrochemical deposition, spray coating, dip coating, gas-phase deposition, roll-to-roll deposition, screen printing, doctor blading, wet coating, dynamic coating, and a combination thereof.

28. The method of claim 25, comprising a), wherein the coating contains at least one of $SiN_3$, $Al_2O_3$, $B_2O_3$, $TiO_2$, $Na_2O$, CaO, $K_2O$, $SO_3$, MgO, and $Fe_2O_3$.

29. A microfluidic chip comprising a single surface layer of a $SiO_x$ film, wherein x is from 1 to <2, said microfluidic chip comprising:
   a first polymeric substrate surface modified by at least one process selected from the group consisting of plasma treatment, reactive ion etching, and UV-Ozone treatment,
   wherein the first etched-glass-like surface has a roughness of >3 nm,
   wherein the first polymeric substrate comprises a sulfonated tetrafluoroethylene based fluoropolymer-copolymer with perfluorovinylether groups terminated with sulfonate groups incorporated into a tetrafluorethylene backbone or poly[1-(trimethylsilyl)-1-[propyne] ("PT-MSP") and forms a portion of a surface of at least one closed conduit;

wherein said microfluidic chip is produced by a method comprising:

modifying the surface of the first polymeric substrate by wet-coating it with $SiO_2$ sol-gel, and treating the modified first polymeric substrate with $Ar/O_2$ plasma for a time and under conditions which increase its surface hydrophilicity to one characterized by a water contact angle <50° and to a surface roughness to >3 nm.

30. A microfluidic chip comprising:

at least one modified first polymeric substrate having a first etched-glass-like surface, wherein the first etched-glass-like surface comprises at least one modification selected from the group consisting of:

1) a single surface layer of a $SiO_x$ film, wherein x is from 1 to <2, 2) a single surface layer of a $SiO_x$ film, wherein x is from 1 to <2 formed by a process comprising coating a surface of the polymeric substrate with an $SiO_x$ precursor and converting said $SiO_x$ precursor into $SiO_x$, and 3) a first polymeric substrate surface modified by at least one process selected from the group consisting of plasma treatment, reactive ion etching, and UV-Ozone treatment, and wherein the first polymeric substrate comprises a sulfonated tetrafluoroethylene based fluoropolymer-copolymer with perfluorovinylether groups terminated with sulfonate groups incorporated into a tetrafluorethylene backbone or poly[1-(trimethylsilyl)-1-[propyne] ("PT-MSP") and forms a portion of a surface of at least one closed conduit;

wherein said microfluidic chip is produced by a method comprising:

modifying the surface of the first polymeric substrate by wet-coating it with $SiO_2$ precursor, converting the $SiO_2$ precursor to $SiO_2$, and treating the modified first polymeric substrate with $Ar/O_2$ plasma for a time and under conditions which increase its surface hydrophilicity to one characterized by a water contact angle <50° and to a surface roughness to >3 nm.

31. The method of claim 26, wherein said polyorganosilazane in iii) has the formula —[Si(R)$_2$—N(R)—]$_n$, R being $C_1$-$C_{20}$ alkyl.

* * * * *